(12) United States Patent
Rapisarda

(10) Patent No.: US 9,863,615 B2
(45) Date of Patent: *Jan. 9, 2018

(54) INSERTABLE LIGHTING MODULE WITH LIGHT EFFECT MATERIAL

(71) Applicant: Carmen Rapisarda, Apple Valley, CA (US)

(72) Inventor: Carmen Rapisarda, Apple Valley, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/582,629

(22) Filed: Apr. 29, 2017

(65) Prior Publication Data

US 2017/0234511 A1    Aug. 17, 2017

Related U.S. Application Data

(63) Continuation-in-part of application No. 15/227,816, filed on Aug. 3, 2016, now Pat. No. 9,706,803, which is a continuation-in-part of application No. 15/227,723, filed on Aug. 3, 2016, now Pat. No. 9,506,643, which is a continuation-in-part of application No. 15/227,752, filed on Aug. 3, 2016, now Pat. No. 9,557,049, which is a
(Continued)

(51) Int. Cl.

| | |
|---|---|
| *F21V 21/08* | (2006.01) |
| *F21V 19/00* | (2006.01) |
| *H05K 1/18* | (2006.01) |
| *F21V 23/00* | (2015.01) |
| *F21V 23/04* | (2006.01) |
| *A43B 3/00* | (2006.01) |
| *A41D 27/08* | (2006.01) |
| *A41D 27/20* | (2006.01) |
| *F21Y 115/10* | (2016.01) |

(52) U.S. Cl.
CPC .......... *F21V 19/002* (2013.01); *A41D 27/085* (2013.01); *A41D 27/205* (2013.01); *A43B 3/001* (2013.01); *A43B 3/0031* (2013.01); *F21V 23/003* (2013.01); *F21V 23/04* (2013.01); *H05K 1/181* (2013.01); *F21Y 2115/10* (2016.08); *H05K 2201/10037* (2013.01); *H05K 2201/10106* (2013.01)

(58) Field of Classification Search
CPC ...... F21V 19/002; F21V 23/003; F21V 23/04; A41D 27/085; A41D 27/205; A43B 3/001; A43B 3/0031; H05K 1/181; H05K 2201/10037; H05K 2201/10106
USPC .......................................................... 362/103
See application file for complete search history.

(56) References Cited

U.S. PATENT DOCUMENTS

| | | | | |
|---|---|---|---|---|
| 5,930,921 A | * | 8/1999 | Sorofman ............ | A43B 1/0036 36/137 |
| 7,857,477 B2 | * | 12/2010 | Wilborn ............... | A41D 27/085 362/103 |

* cited by examiner

*Primary Examiner* — Elmito Breval
*Assistant Examiner* — Jessica M Apenteng
(74) *Attorney, Agent, or Firm* — Roy L. Anderson

(57) ABSTRACT

A lighting unit is removably inserted into a pocket to create a light effect through use of a light effect material. The lighting unit has a PCB with a first side to which one or more LEDs and a battery are mounted. A clear potting material encloses the PCB, LEDs, and the battery and creates a transparent space proximate an inner surface of the light effect material which maintains the light effect material at a preselected distance from the LEDs so that light emitted from each light emitting die is dispersed by a plurality of dispersive elements in the light effect materials to create the light material viewing effect.

19 Claims, 24 Drawing Sheets

Related U.S. Application Data continuation-in-part of application No. 14/709,203, filed on May 11, 2015, now Pat. No. 9,445,641.

(60) Provisional application No. 61/991,841, filed on May 12, 2014, provisional application No. 62/019,287, filed on Jun. 30, 2014, provisional application No. 62/061,110, filed on Oct. 7, 2014, provisional application No. 62/062,284, filed on Oct. 10, 2014, provisional application No. 62/064,958, filed on Oct. 16, 2014.

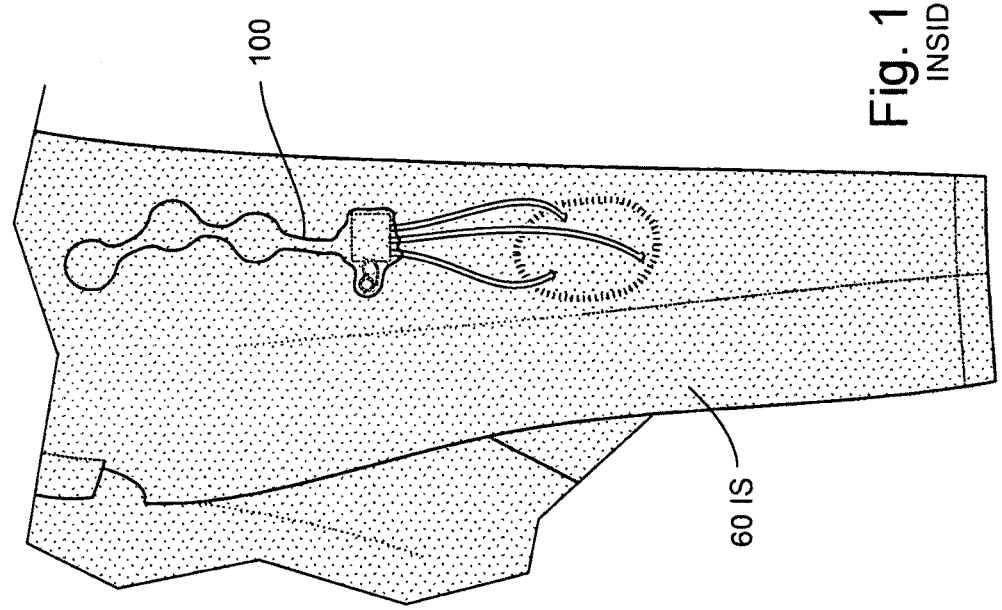
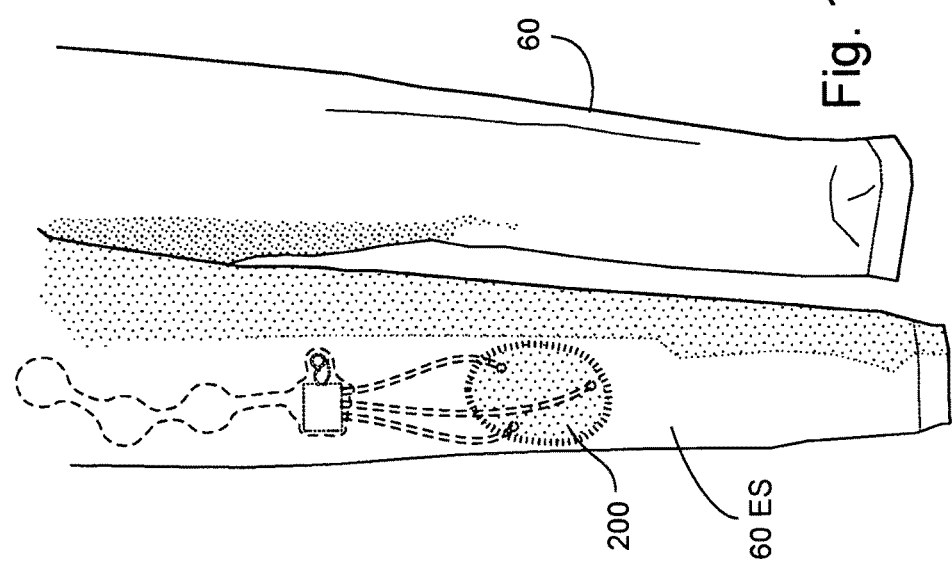

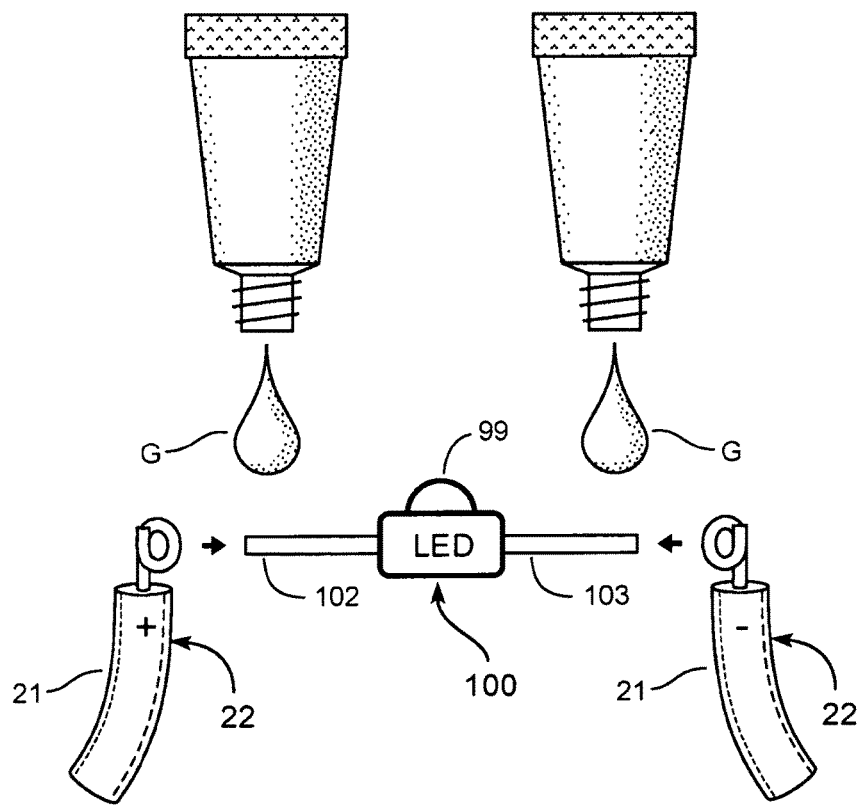
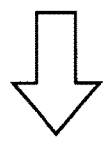
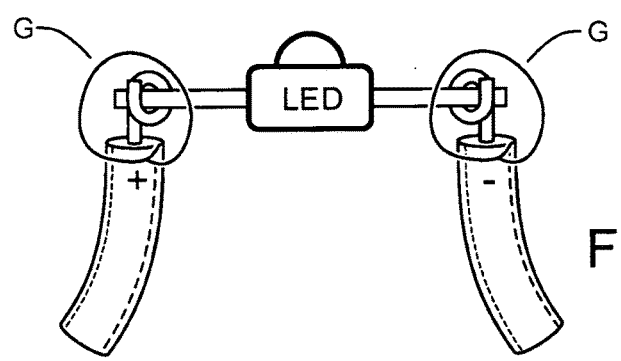
Fig. 21A
Fig. 21B

INSERTABLE LIGHTING MODULE WITH LIGHT EFFECT MATERIAL

CROSS REFERENCE TO RELATED APPLICATIONS

This application is a continuation-in-part application of U.S. Ser. No. 15/227,816, filed Aug. 3, 2016, which itself was a continuation-in-part application of U.S. Ser. No. 15/227,723, filed Aug. 2, 2016, now U.S. Pat. No. 9,506,643, issued Nov. 29, 2016, which itself is a continuation-in-part application of U.S. Ser. No. 15/227,752, filed Aug. 2, 2016, now U.S. Pat. No. 9,557,049, issued Jan. 31, 2017, which itself was a continuation-in-part application of U.S. Ser. No. 14/709,203, filed May 11, 2015, now U.S. Pat. No. 9,445,641, issued Sep. 20, 2016, the disclosures of all of which are specifically incorporated herein by reference in their entirety.

U.S. Ser. No. 14/709,203 is a non-provisional utility application that claims priority from the following provisional patent applications, the disclosures of all of which are specifically incorporated herein in their entirety by reference: U.S. Ser. No. 61/991,841, filed May 12, 2014, entitled "LED Lighting Module;" U.S. Ser. No. 62/019,287, filed Jun. 20, 2014, entitled "LED Embedded Wire;" U.S. Ser. No. 62/061,110, filed Oct. 7, 2014, entitled "Footwear with Light Effect Material;" U.S. Ser. No. 62/062,284, filed Oct. 10, 2014, entitled "Footwear with Light Effect Material;" and U.S. Ser. No. 62/064,958, entitled "Footwear with Light Effect Material."

FIELD OF THE INVENTION

The present invention is generally in the field of a LED lighting module that can be used in a variety of different products, examples of which include, but are not limited to, footwear and clothing.

BACKGROUND OF THE INVENTION

Lighting systems have been used before both with footwear and with clothing, examples of which are set forth in my prior U.S. Pat. Nos. 5,649,755 and 7,347,577, the disclosures of which are specifically incorporated herein by reference. If a lighting module is to be used with clothing, it must not only be durable, but it must also be washable. One way this has been done before is to include both the lighting module and the lights within a pouch that is waterproof, such as is taught in U.S. Pat. No. 7,857,477. However, such a pouch has a number of limitations, and the present invention therefore seeks to improve such prior devices.

SUMMARY OF THE INVENTION

The present invention is generally directed to a lighting unit which can be removably inserted into a pocket which creates a light effect through use of a light effect material.

The light effect material has an inner surface and an outer surface with a plurality of dispersive elements and the light effect material may be part of the pocket or separately insertable within the pocket and/or part of an assembly containing the lighting unit.

The lighting unit has a PCB with a first side to which one or more LEDs and a battery are mounted. Electronics are also mounted to the PCB for turning on an electrical circuit which includes any LEDs to cause each light emitting die of each LED to emit light. A clear potting material encloses the PCB, LEDs, the battery and the electronics and creates a transparent space proximate the inner surface of the light effect material which maintains the light effect material at a preselected distance from the LEDs and each light emitting die is substantially parallel to the light effect material so that light emitted from each light emitting die is dispersed by the plurality of dispersive elements so as to create the light material viewing effect. The lighting unit can be enclosed within two pieces of material (one of which can optionally be the light effect material) to form an assembly.

One or more pockets can be attached to an article of manufacture, such as a garment, one example of which is a shoe, and means may be provided for enclosing the lighting unit within the pocket.

Accordingly, it is a primary object of the present invention to provide a lighting assembly useful with light effect material in articles of manufacture, and especially clothes and footwear, which enhances the visual effect of one or more LEDs.

This and further objects and advantages will be apparent to those skilled in the art in connection with the drawings and the detailed description of the preferred embodiment set forth below.

BRIEF DESCRIPTION OF THE DRAWINGS

FIG. 1 illustrates an LED spaced behind a light effect material of the present invention while

FIG. 3 illustrates a light effect material according to the present invention in which a surface of a material, such as PVC, creates the light effect while

FIG. 7 illustrates a sheet of light effect material with square repeating patterns while FIG. 8 provides details regarding one such square pattern and adjacent squares. FIG. 9 is a side view that conceptually illustrates smaller squares, as illustrated in FIG. 8, some of which are creating visible light effects and some of which are not.

FIG. 13 is a side view while

FIGS. 16C and 16D illustrate the lighting unit of FIG. 16 attached to a pair of pants, FIG. 16C illustrating the lighting unit from outside the pants, FIG. 16D illustrating the lighting unit from inside the pants.

FIG. 20A is a cross-sectional view that illustrates an LED positioned to be inserted down into a ribbon wire while

FIG. 21A and 21B illustrate bonding of two exposed conductors of two insulated wires to axial leads of an axial LED.

FIG. 22 illustrates a composite LED embedded wire according to one aspect of the present invention while

DETAILED DESCRIPTION OF THE INVENTION

As the present invention sets forth an improvement over the inventions disclosed in my earlier filed U.S. Ser. No. 15/227,816, this description will first set forth the inventions disclosed in said earlier application for reference and then describe the new improvements over my earlier disclosures.

It has been found that there are a variety of fabrics and/or materials that can accentuate the effect of light emitted from an LED, or, more preferably, from multiple LEDs lit together or in a sequence, especially if the distance between the LEDs and the fabrics and/or materials is varied between acceptable limits. For ease of reference and for definitional purposes, such fabrics and/or materials will hereinafter be generically referred to as "a light effect material."

A light effect material creates a visually interesting effect in which light from an LED behind such material, relative to a viewer on the other side of the material, will see a dispersed pattern of light created by the material, when the light effect material is located at an acceptable distance between a viewer and one or more LEDs. A light effect material must be sufficiently sheer or transparent to allow light from an LED to pass through it and be seen by a viewer's eye, but it must also have a structure that allows some of the light from the LED to reflect along its structural components to disperse light and create a noticeable optical effect. It is for this reason that a light effect material, if it is located directly adjacent to an LED, will have little or no noticeable optical effect, whereas the same will be true if it is located too far away from an LED. In choosing a material with dispersive elements, it is especially desirable to choose a clear or white material with prismatic properties instead of a colored material when the material is being used with multi-colored LEDs, so that the color of the material with reflective elements does not interfere with the color of the LEDs. In connection with such a light effect material, it is important that the reflective and/or refractive elements are sufficiently small so that they give the appearance of creating multiple points of light for each LED, rather than simply acting as a prism or a large multifaceted lens. Also, it is especially useful if multiple LEDs are spaced apart from light effect material so that multiple LEDs, especially of different colors, can overlap each other to create blended light effects.

Figure 1:
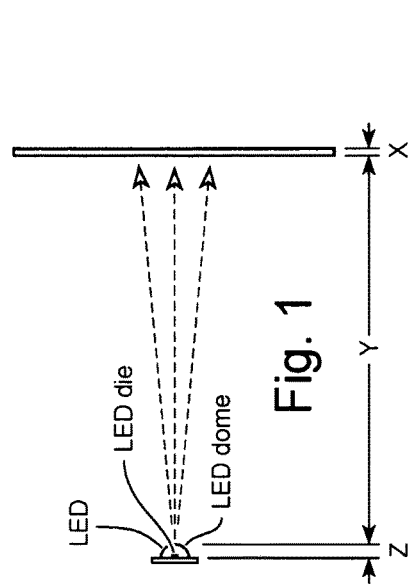

FIG. 1 illustrates an LED spaced apart from a light effect material (the LED can be a bi-pin LED, an axial lead LED or a surface mount LED). The LED has a light emitting die which rests on a base and is covered with a dome. The light emitting die of the LED emits light and, in one especially preferred embodiment of the present invention, the light effect material has active elements which create the light effect that are roughly the size, or within several orders of size magnitude, as that of the width of the semiconductor die used in an LED. Also, although the distance Y between the LED and the light effect material can vary, it has been found that a distance of around 10 to 2000 times that of the LED (Z in FIG. 1) is effective where the light effect material has a thickness X which is roughly the same as Z.

Figure 3:
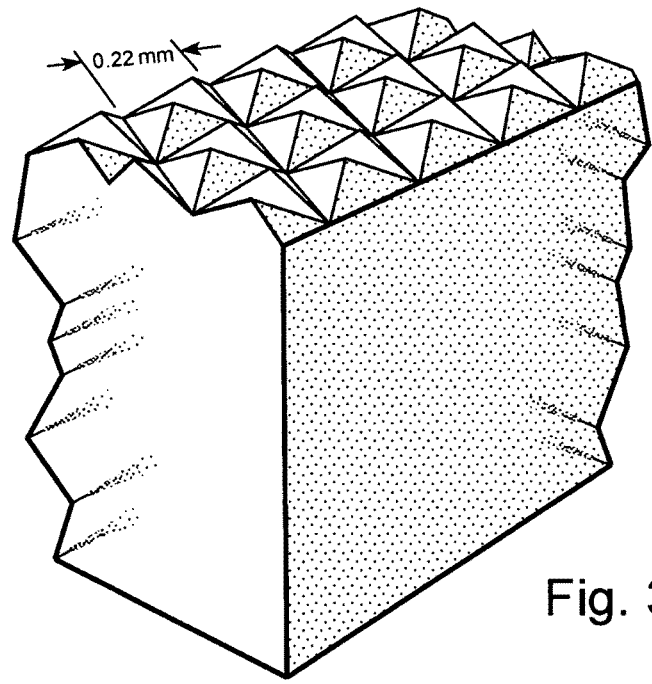
Figure 4:
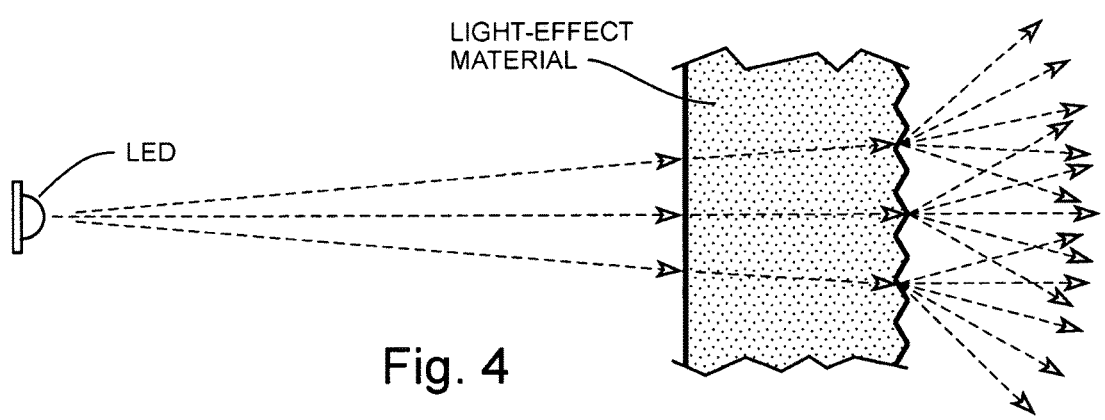
FIG. 4 illustrates use of the light effect material illustrated in FIG. 3.
Figure 8:
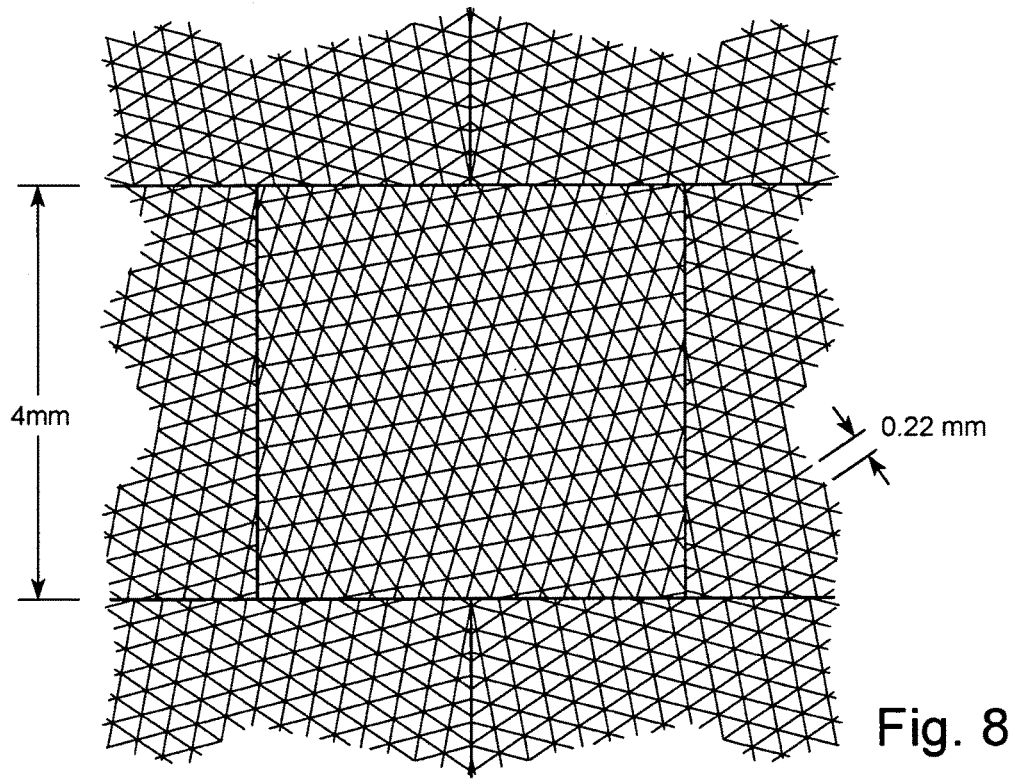

An example of a material that can function as a light effect material according to the present invention, which is an especially preferred embodiment, is a material with microscopic reflective and/or refractive elements on its outer surface relative to an LED (meaning that rays of light emitted from the LED will pass into an inner surface of the light effect material and then exit the light effect material at its outer surface and then continue on to a viewer) that serve to disperse light. One example of such a material is illustrated in FIGS. 3 and 8. In this example the light effect material is created as a surface layer of a larger piece of material, such as PVC or polyurethane, and the microscopic reflective and/or refractive elements can be machined or cut into the sheet or created by a molding process. The reflective and/or refractive elements in this example have a pyramidal shape (see FIG. 3) when viewed up close, but alternating squares of such shapes are configured at different angles as is illustrated in FIG. 8 in which the triangular lines represent the base lines of the pyramidal shapes illustrated in FIG. 3 and the top pyramidal points of FIG. 3 would be located in the centers of the triangles shown in FIG. 8 (except that such points and the angled surfaces converging at such points are not shown so that the size of the pyramidal base lines can be accurately set forth). Note also that the elements extend away from the surface relative to the location of one or more LEDs, as is illustrated in FIG. 4.

Figure 7:
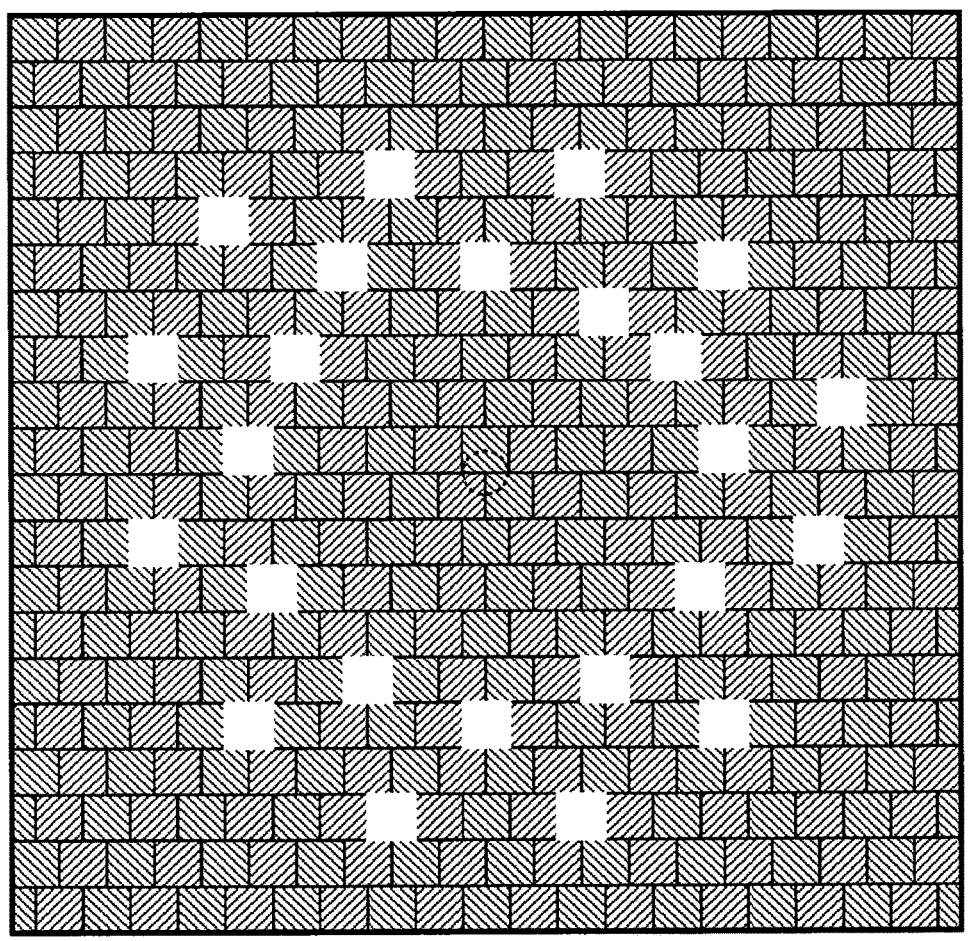
FIGS. 7-9 are related to the light effect material illustrated in FIG. 3.
Figure 9:
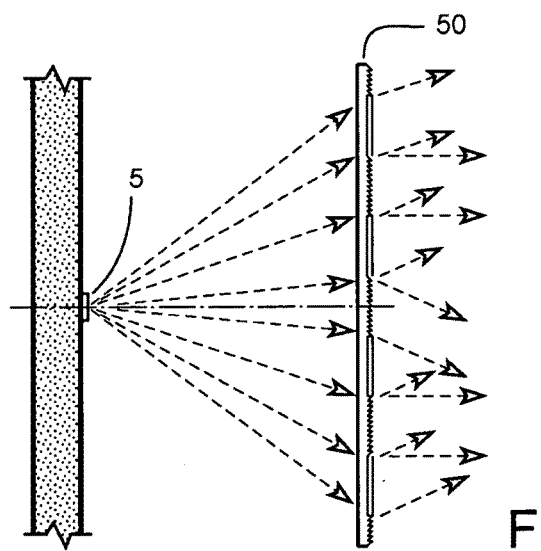

In connection with the light effect material illustrated in FIGS. 3 and 8, alternating squares of repeating patterns, each different from an adjacent square, help create a mosaic like surface having microscopic surfaces. Due to the differences in the microscopic elements of such light effect material, some squares of microscopic surfaces may create a light effect that can be viewed by a viewer, while others will not, which is conceptually illustrated in FIG. 9 as a simple alternating pattern of squares that do and not create a light effect. (In connection with FIG. 9, it is worth noting that the physical size of the LED semiconductor die is actually roughly the same as a single base line of one of the pyramids of one of the squares illustrated by FIG. 8, but the LED, for purposes of illustration only, is not drawn to such scale in FIG. 9). However, the alternating patterns can be designed in more complex patterns to create desired effects, examples of which are illustrated in FIGS. 5 and 7.

Figure 5:
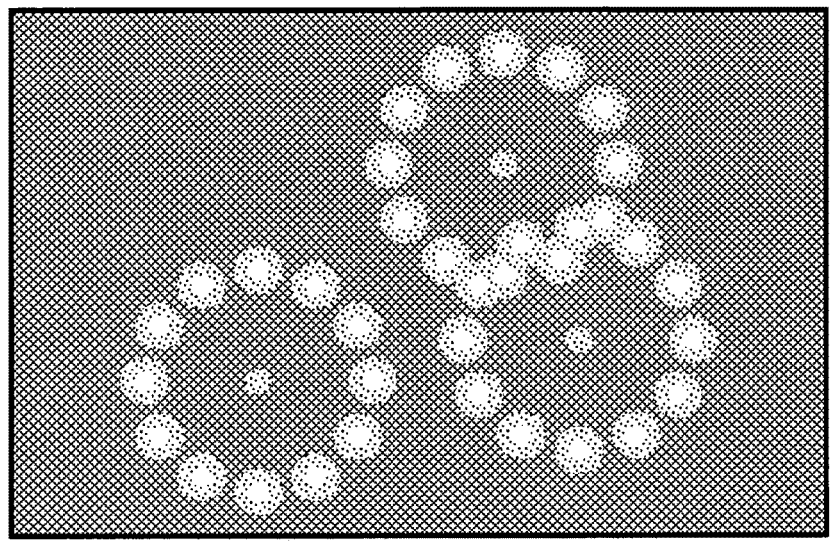
FIGS. 5 and 6 illustrate what a viewer would perceive when viewing two different light effect materials spaced apart from three LEDs according to the present invention.

In FIG. 5, a viewer at a certain distance views a circle of lights, such as twelve, about a central, dimmer light, all of which are produced by a single LED. This effect is conceptually illustrated in FIG. 7, albeit with a different number of lights, in which the squares without any cross hatching represent squares of the light effect material having microscopic elements that create a viewable effect whereas the squares with cross hatching do not create a viewable effect (at least at the particular distance from which the material is being viewed by a viewer).

Figure 6:
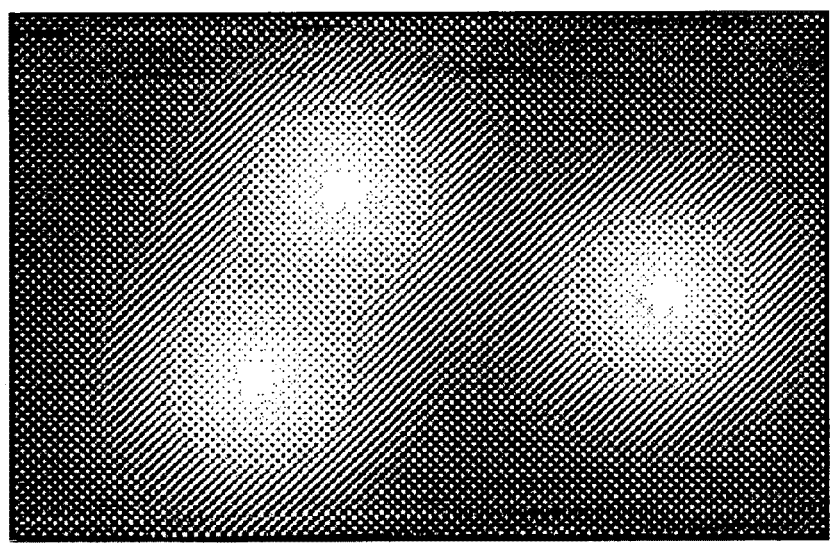

While FIG. 8 illustrates a light effect material in which microscopic elements are arranged in a mosaic pattern that can be used to achieve recognizable patterns, microscopic elements can also be arranged randomly, or nearly randomly, to achieve a different light effect, such as that which is illustrated in FIG. 6.

Another example of material that can function as a light effect material according to the present invention is a shiny filament fabric material, which may or may not be sheer, in which light appears to travel along structural fabric components to disperse light and create an optical effect. In such fabrics, the further the fabric is away from the light source, the greater the optical effect that is observable, up to a limit in which the effect is lost because the distance is too great. Such a light effect material can be used on its own or affixed to another layer of material, such as, for example, transparent PVC, which can then be incorporated into the structure of footwear.

Figure 10:
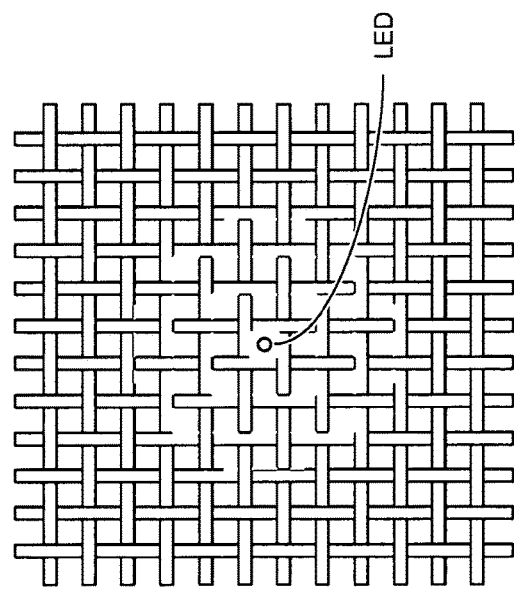
FIG. 10 illustrates one light effect material according to the present invention that uses shiny filament woven fabric with an LED being shown emitting light behind the fabric relative to a viewer viewing the LED from the opposite side of the fabric.

FIG. 10 illustrates a light effect material that uses a woven fabric material in which the shiny filaments of the woven fabric help create a light effect. As illustrated in FIG. 10, an LED is located behind the woven fabric light effect material and a viewer sees a light effect in which the linear fabric material is illuminated within a certain distance emanating away from a central point of the LED behind the light effect material relative to a viewer. The result, in this instance, is a design in which the light from a single LED is greatly enhanced to give a light effect more equivalent to that of several LEDs.

Figure 2:
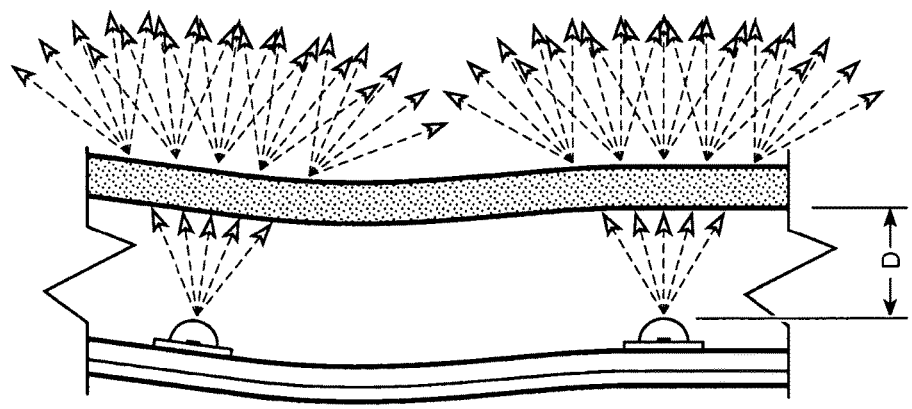
FIG. 2 illustrates a side view of multiple LEDs behind a light effect material according to the present invention.

Multiple light effect materials can be layered on top of each other to create a hybrid light effect. Thus, for example, two sheets of light effect material, such as are illustrated in FIGS. 2 and 7, can be layered on top of each other—in this example, the thickness of the light effect material, between its inner surface and its outer surface where the dispersive elements are located, serves as a transparent space between the two layers of dispersive elements located on the outer surface of the two sheets of light effect material, thus enhancing the hybrid light effect.

Accordingly, a variety of different light effect materials can be used to create different light effects. Common to all such materials is use of very small, or microscopic, elements which create visible light effects in which an LED is no longer viewed as simply a single point source of light, but as something more akin to that which is produced by additional LEDs.

One or more sheets of light effect material can be used as an outer surface of a lighting element according to the present invention, or they can be protected by an outer transparent layer. It is especially preferred, if an outer protective transparent layer is used, that the outer surface of a light effect material located next to the outer transparent layer material be sealed so that liquid, which may contain soap and the like, is not allowed to reach the dispersive elements of the outer surface of the light effect material during a wash cycle so that no residue is trapped or deposited on the dispersive elements that might diminish their light dispersive effect.

When a lighting unit according to the present invention is being manufactured, the light effect material and spacing mechanism can be thought of as half the unit, the other half being the LEDs and electronics used to power the LEDs, such as a power source (which can be one or more batteries), a control device powered by the power source for controlling electric current provided to the LEDs (which may have a light sequencer or timer or other electronics, all of which can be contained on a PCB), a switch (such as a motion detector switch, an example of which is U.S. Pat. No. 9,396,887) and one or more electrical connectors (such as conductive wires) to connect the LEDs to the control device. With such a construction, both of said halves, namely the lighting half and the electronics half, can be separated, if desired, or combined into a single unit (and, indeed, if desired, but not especially preferred, the LEDs can be mounted on a PCB with the other electronics), depending upon designer choice. Thus, for example, the two halves might be included in a single applique construction, or they can be separated, so that the electronics can be placed on an underneath surface of a garment or surface to which the lighting unit is attached, while the lighting half is placed on the outer surface.

The electronics half of a lighting unit according to the present invention can take many forms, as can the connectors to the LEDs, depending upon a number of factors related to the electronics, but not to operation of the light effect material itself. Thus, for example, one or more LEDs can be connected to a PCB by a conductive wire, and the LED(s) can be soldered to the end of the conductive wire; alternatively, as will be disclosed in greater detail below, the LEDs can be attached to the end of the conductive wire without the use of solder by use of glue, or, in an especially preferred embodiment, multiple axial lead LEDs can be connected together by a surface (such as a surface from a transparent spacing layer) and a piece of tape, or two pieces of tape can be used to form the axial lead LED assembly, with an outer surface with adhesive of one of the pieces of tape used to then attached the assembly to a transparent spacing layer. One of the significant aspects of such variety of construction alternatives is that the LEDs and electronics need not all be included in a waterproof compartment and, depending upon construction, need not even be included in a waterproof compartment if the power source and switch have been waterproofed, such as by application of a suitable waterproofing material.

Figure 11:
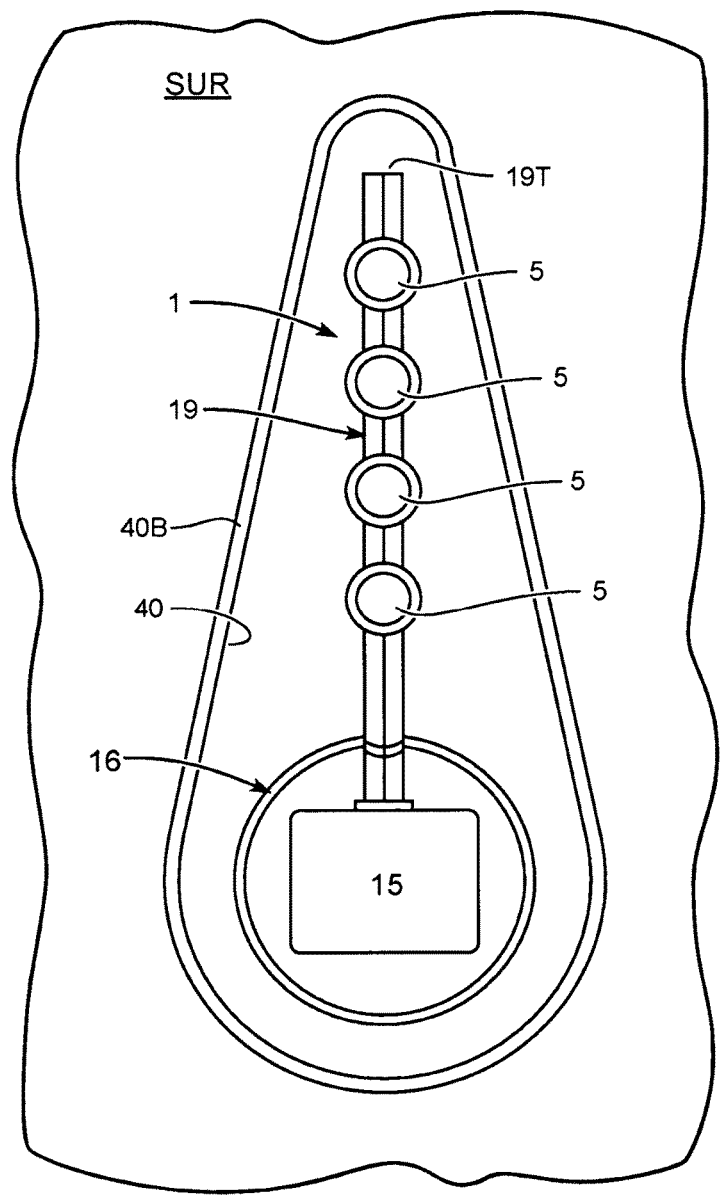
FIG. 11 is a top plan view that illustrates an LED lighting unit according to one aspect of the present invention in which a ribbon wire assembly has been connected to a control unit, a watertight bag has been secured to the ribbon wire assembly to make the control unit watertight, and then this assembly has been secured to a surface through use of an appliqué wall.

FIG. 11 illustrates a lighting unit 1 in accordance with the present invention in which a ribbon wire assembly 19 mounted with multiple LEDs 5 is connected to a control module 15 having a power source and control electronics, such as a motion detector switch, electronics for controlling the sequencing of the LEDs, and the like. Control module 15 is mounted to a first end of the ribbon wire assembly and a watertight bag 16 is sealed around the control module to the ribbon wire assembly to protect control module 15 while leaving ribbon wire assembly 19 outside of it exposed to the environment. Watertight bag 16 can be sealed about ribbon wire assembly 19 by a shrink wrap step, a heat seal, a sonic weld, a clamp, glue or some other sealing means, depending upon the construction of watertight bag 16 (which can take any number of shapes, but a bag that fits snugly about control module 15 helps to eliminate unnecessary bulk) so that a watertight seal is formed between watertight bag 16 and ribbon wire assembly 19. Terminating end 19T of ribbon wire assembly 19 (i.e., the end distant from control module 15) can be sealed from the environment by a heat seal, a cap, glue or a combination of such seals or other sealing means. The resultant structure, lighting unit 1, can be incorporated into a variety of articles of manufacture, illustrative examples of which are garments and footwear, without concern over the necessity of protecting ribbon wire assembly 19 and LEDs 5 from the environment.

Because an especially preferred lighting unit according to the present invention does not require its LEDs to be sealed from the environment, it can be used in a variety of ways for a variety of products, including many new ways in which it can be used with garments and footwear, many of which will become more apparent with the discussion below.

Figure 12:
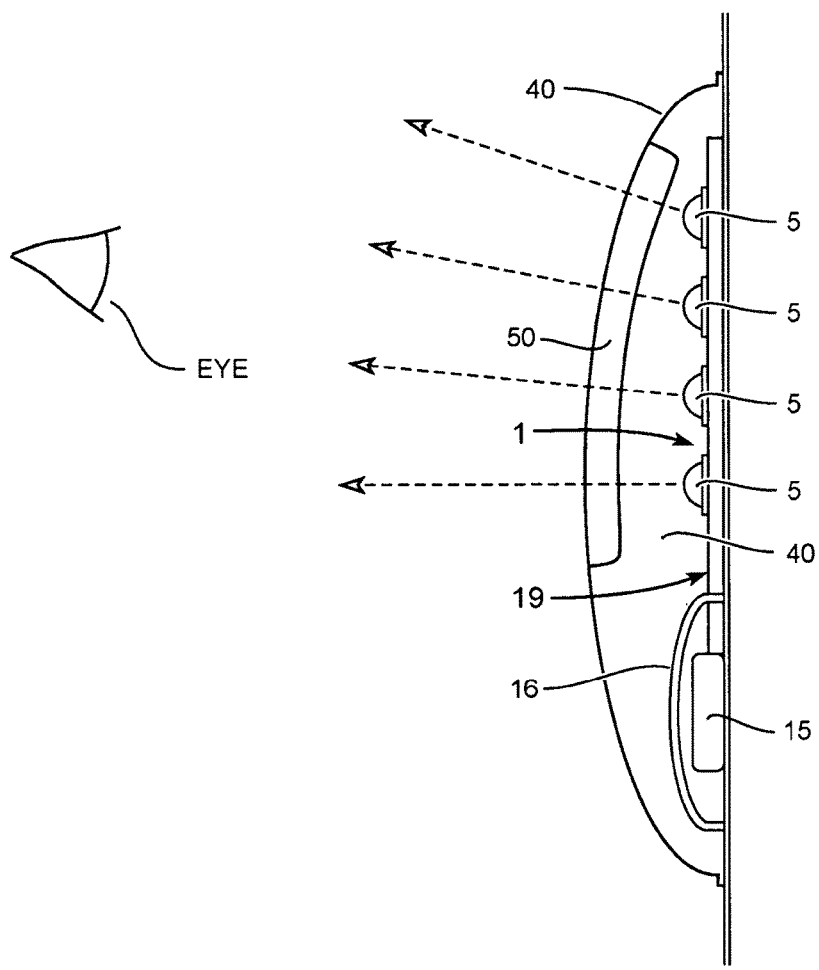
FIG. 12 is a side view of FIG. 11.

One way in which a light effect material can be incorporated into a garment is to use the light effect material inside of an appliqué or patch or even use light effect material 50 to make outer appliqué wall 40. An applique or patch can be conveniently attached to an article of manufacture, such as, for example, a garment, by heat sealing, stitching or glue or another attachment mechanism. An example of such an appliqué is illustrated in FIGS. 11 and 12 in which an outer appliqué wall 40 holds lighting unit 1 against a surface SUR, such as a surface of a garment, backpack, or other article of manufacture. If appliqué wall 40 is to be stitched or bonded to surface SUR, it may be desirable to leave an appliqué border 40B for use in forming stitches or for bonding, while the rest of appliqué wall 40 may extend outwardly from surface SUR and form a pocket in which lighting unit 1 is held. Note that surface SUR does not need to be watertight, although it certainly might be; if SUR is a non-watertight fabric, such as, for example, cotton or a cotton blend in a garment, the pocket will not be watertight when the garment is washed, but components in control module 15 will be protected by watertight bag 16 (which is sealed) while the LEDs and ribbon wire will still be protected from water, even during a washing, because of the inventive structure already described herein. Note also that while appliqué wall 40 may be used as an outside surface with respect to underlying surface SUR, it can also be used as an inside surface with respect to the underlying surface SUR so that the appliqué is located underneath surface SUR, rather than being on top of surface SUR. Further note that appliqué wall 40 need not be permanently attached to surface SUR and, might instead, be detachable from surface SUR by a detachable connection mechanism, an example of which is a hook and loop fastener, such as a Velcro® fastener. One of many advantages of a detachable appliqué wall is that a variety of different lighting units 1 might be used in an article of manufacture with such a detachable appliqué, depending upon user selection, and such units might be periodically varied.

Figure 13:
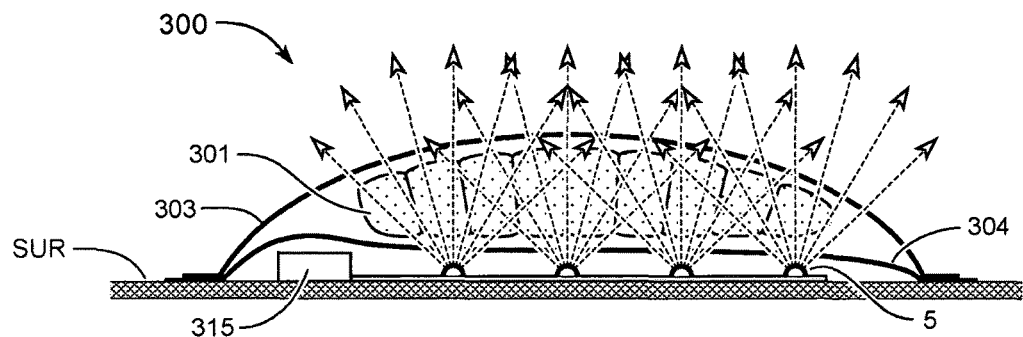
Figure 14:
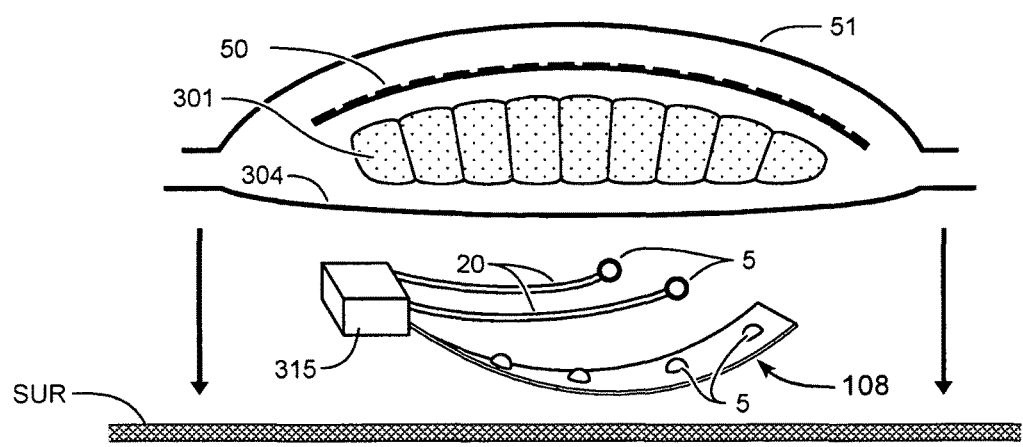
FIG. 14 is an exploded view illustrating one appliqué constructed in accordance with the present invention.

Appliqué 300 can be constructed in any of a number of different ways, an example of which is illustrated in FIGS. 13 and 14. While light effect material 50 is illustrated as being positioned underneath outer material layer 51, it is also possible that the two layers can be combined in a single layer such that a surface of this single layer has the light effect material while other portions of the surface contain opaque or printed design material. A transparent spacer material, one example of which has a pillow-like construction 301, is used to space light effect material 50 away from LEDs 5 which can be affixed to the spacer by adhesive on spacer 301 or by a separate tape layer 304 illustrated in FIG. 14 (or by any other suitable means, depending upon the construction of materials being used, such as tape used with composite LED embedded wire 108). Other suitable spacer materials might include bubble wrap type of material or even clear solid spacers, but hollow spaced materials are especially preferred due to reduces cost and weight. The appliqué illustrated in FIG. 14, for purposes of illustration only, shows use of composite LED embedded wire 108 and two other wires having a single LED affixed at its end, which can be an axial lead LED 99 or a multi-pin LED. Control unit 315 is illustrated as having three inputs to its interior (two conductive wires 20 and one composite LED embedded wire 108), but this number can be varied. And, rather than using a control unit 315 and a separate bag 6 (as illustrated in FIG. 12), FIG. 14 illustrates an alternative control unit 315 which might take the form of a case, in which the power source and control electronics are housed, and a potting or other material can be added to effectively create a watertight seal around the electronics inside of the case, thus creating a sealed watertight control module which does not need a watertight bag 16 to create a watertight seal.

Figure 15A:
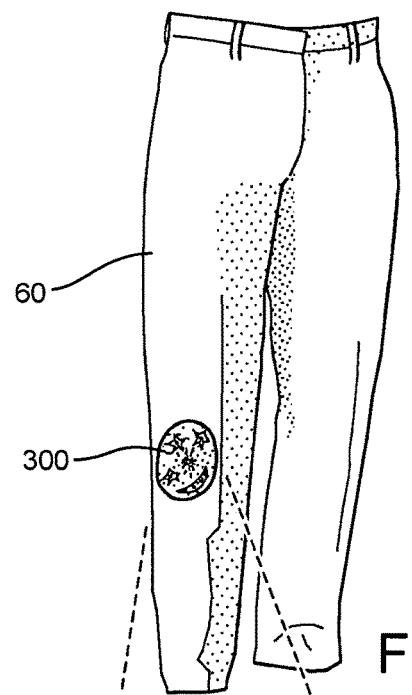
FIGS. 15 and 15A illustrate an appliqué in accordance with the present invention affixed to a pair of pants.
Figure 15:
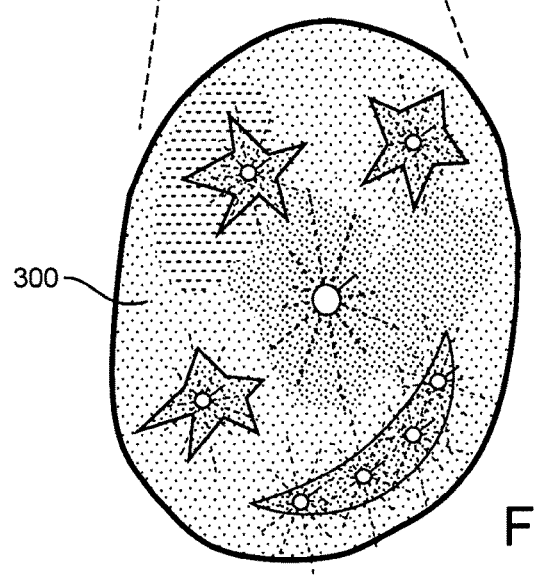

Applique 300 may also be designed with aesthetics useful in connection with specific applications or garments. For example, appliqué 300 may contain an opaque area or pattern or design printed material on an outer material layer 303 that obscures control module 315 and its surface and light effect material 50 may be designed to bring out certain aesthetic design features that complement the pattern or design printed material observable to one viewing appliqué 300 as is illustrated in FIGS. 15A and 15B.

The applique described so far has been a single applique, which aids in ease of incorporation into a garment, but there may be times when it is desirable for the components of lighting unit 1 not to be included in a single applique.

Figure 16:
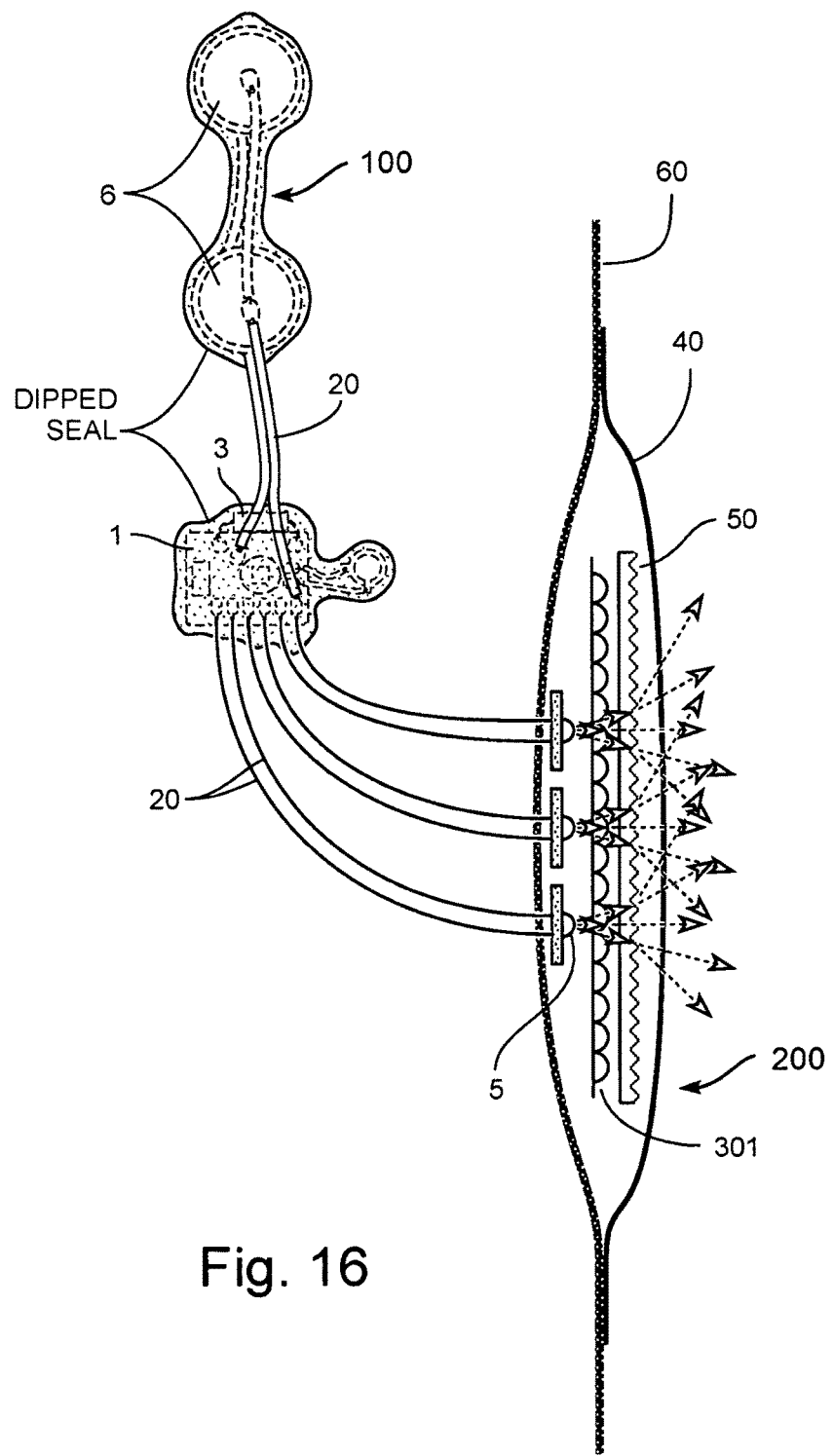
FIG. 16 is a conceptual illustration of a lighting unit according to the present invention illustrating an electronic assembly connected to a light effect assembly.

FIG. 16 illustrates, conceptually, a lighting unit according to the present invention in which 3 LEDS are located on a fabric surface and then a transparent spacing layer 301 of bubble wrap is used to space the 3 LEDs from light effect material 50 and then clear cover 40 is used to form an outer protective surface. Note that the layers illustrated in FIG. 16 are shown as being spaced apart from each other for ease of visual observation and understanding, but such spacing will not exist in a manufactured product. Note also that FIG. 16 illustrates the electronic components of the lighting unit, apart from the 3 LEDs, as being behind the fabric relative to the 3 LEDs, which is one manufacturing option, but the electronic components can also be included in one or more appliques attached to an outer surface of the fabric.

Figure 16A:
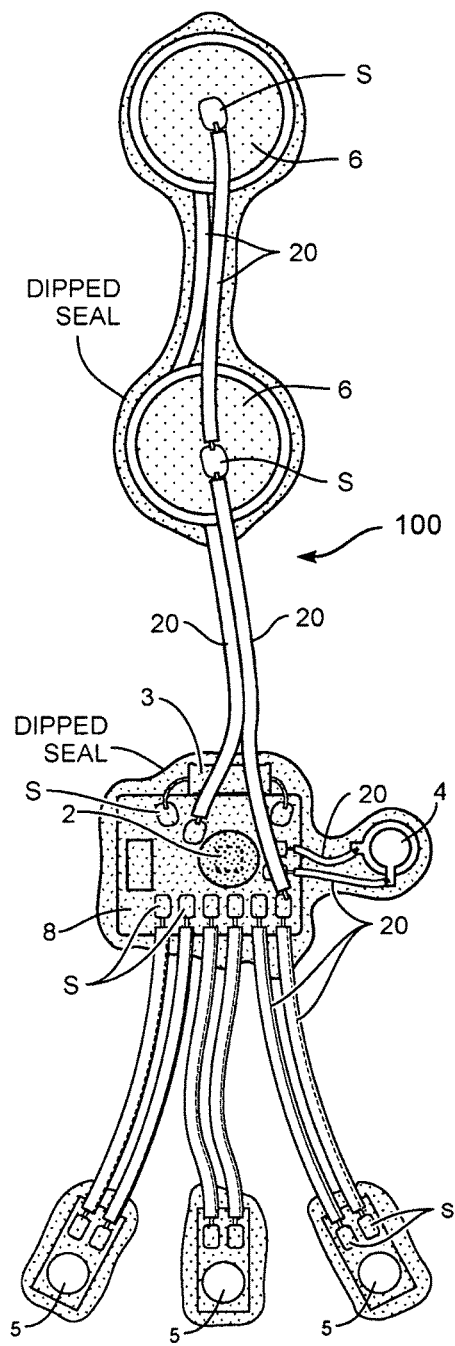
FIGS. 16A and 16B illustrate alternative embodiments of the electronic assembly shown in FIG. 16.
Figure 16B:
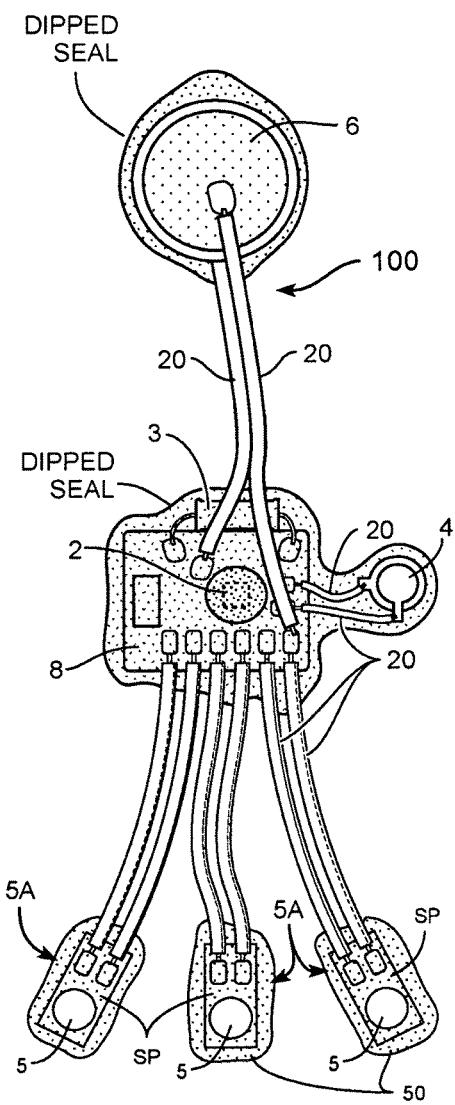

FIGS. 16A and 16B illustrate one way in which electronic components, including LEDs, can be manufactured as an assembly for use in a lighting unit according to the present invention, the difference between FIG. 16A and 16B being that FIG. 16A illustrates the use of two batteries 6, whereas FIG. 16B illustrates use of a single battery 6. In this embodiment, the battery or batteries are spaced apart from a PCB 8 by use of wires 20, but one or both batteries could also be directly attached to PCB 8 in an alternative embodiment. PCB 8 has electronics 2 (e.g., a microprocessor or integrated circuit and, possibly, other electronics) which serve as a controller and switch 3 (such as a motion sensitive switch) directly mounted to it. A master manual on/off switch 4 (for manually turning lighting unit 1 on and off) is connected to PCB 8 by wire 20, although in an alternative embodiment this switch is omitted. Wires 20 connecting electrical components to PCB 8 can be soldered to PCB 8 by use of solder S, as is illustrated in FIGS. 16A and 16B, but they can also be connected by other means without the use of solder. LEDs (illustrated functionally in FIGS. 16A and 16B without any detail by reference numeral 5) can be soldered to a PCB 5P to which wires 20 also soldered and the resulting single LED assemblies 5A can optionally be coated with a waterproofing material, an example of which is a dipped seal.

Electronic assemblies 100 illustrated in FIGS. 16A and 16B are waterproof and can function even if they are exposed to water, as would be the case in a wash cycle. Because the electronic assemblies are waterproof, they need not be placed in a waterproof compartment, which creates flexibility in the design and manufacturing process as to how electronic assemblies are incorporated into articles of manufacture with a light effect material and transparent space.

FIGS. 16, 16C and 16D illustrate how an electronic assembly can be attached to a garment, in this case a pair of pants, by locating the electronic assembly, except for LED assemblies 5A, separate from a light effect assembly 200; both assemblies can be located on the outer surface of the fabric (and separately attached or included in a single attachment) or the light effect assembly 200 can be located on the outer surface and the electronic assembly can be located on the inner surface of the fabric (see FIG. 16), although the latter construction requires one or more holes in the garment so that LED assemblies 5A can be attached to and positioned within light effect assembly 200. Also, light effect assembly 200 need not always be a single assembly with multiple LEDs, and multiple light effect assemblies might be used, or even, if desired based upon designer choice, a single light effect assembly might be used for each LED.

Figure 17A:
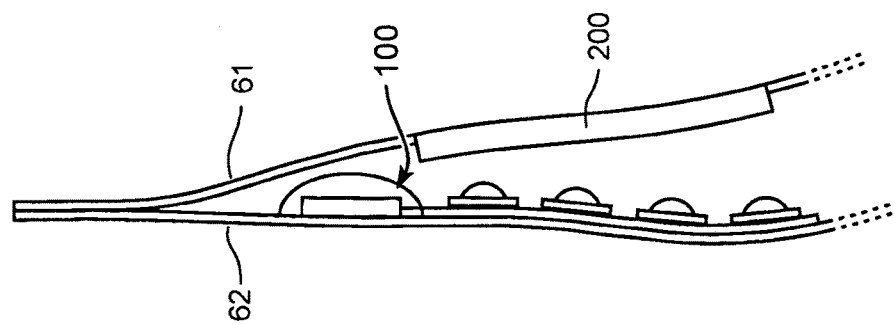
FIGS. 17A and 17B are side views illustrating two ways the skirt from FIG. 17 can be constructed in accordance with one aspect of the present invention.
Figure 17:
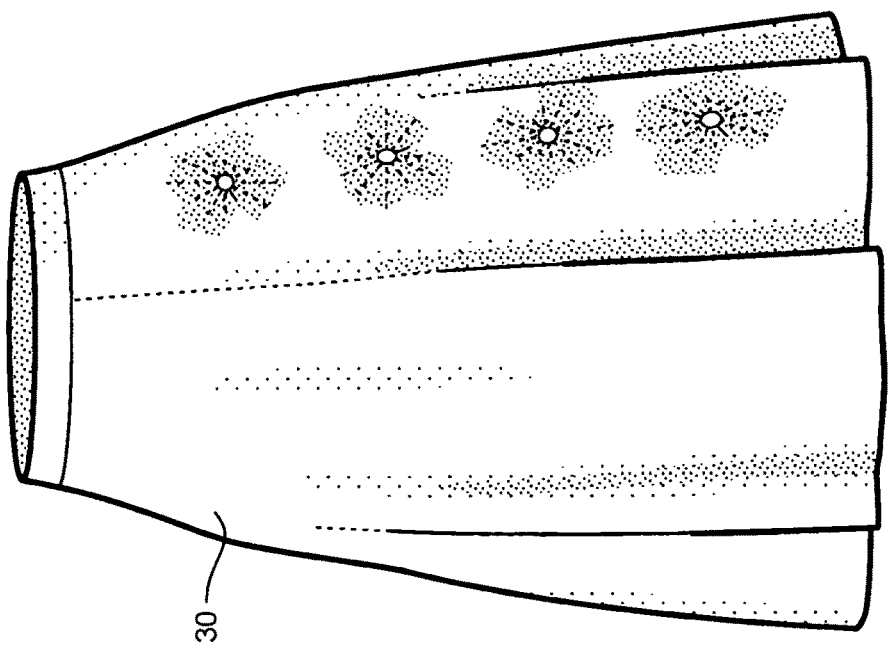
FIG. 17 illustrates a skirt with LEDs according to the present invention incorporated into the skirt.
Figure 17B:
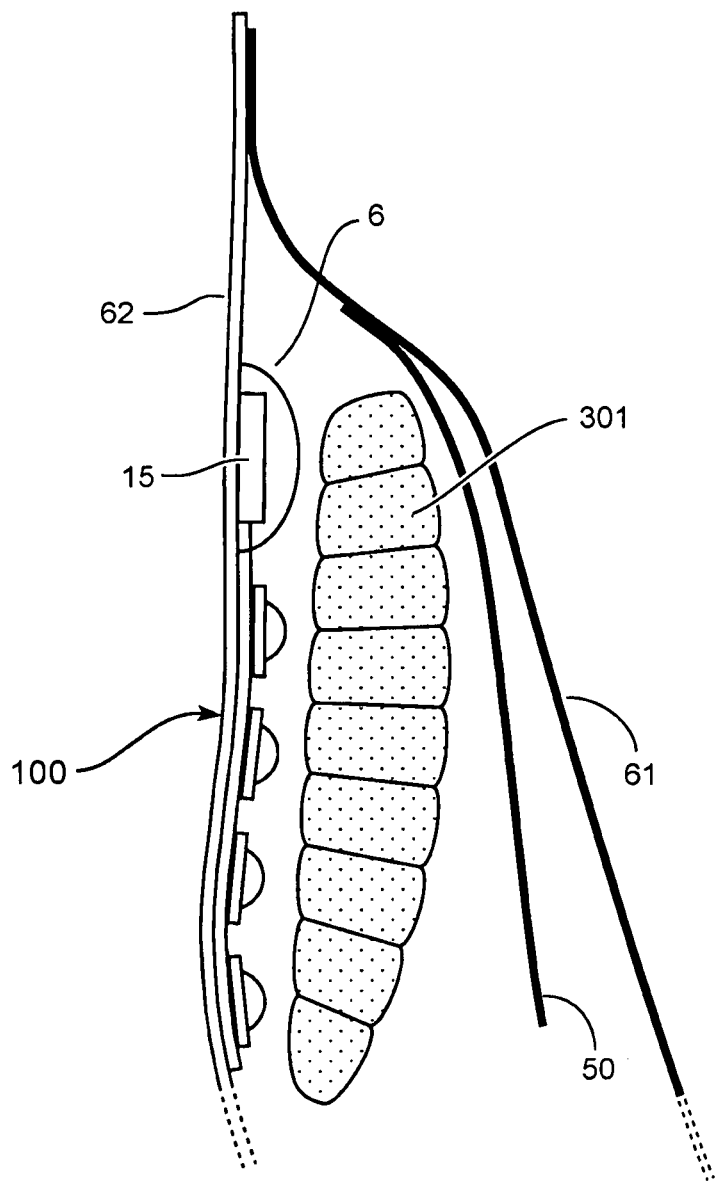

Another way in which a light effect material can be incorporated into a garment is to use the light effect material as a covering layer over another layer containing one or more LED lighting modules and, in such an embodiment, it is especially preferred that the outer layer of light effect material be free to move and vary its distance with respect to the underlying layer containing at least one LED lighting module. An example of a garment 60 that can employ such a construction is a skirt, an example of which is illustrated in FIGS. 17, 17A and 17B. In this illustrative example, outer garment layer 61 is made of, or contains, a light effect material 50 which is positioned so as to be located over electronic assembly 100 mounted to inner garment layer 62 when the skirt is in a resting position (light effect material 50 might also be attached to or affixed behind a see through outer fabric). However, if a person is wearing the skirt and moving about, such as running or maybe twirling about, outer garment layer 61 might start to vary its distance from electronic assembly 100 (see FIG. 17A), thus varying the optical effect. Light effect material 50 might be distanced from electronic assembly 100 in a resting mode (e.g., when it hanging on a rack) by a number of means, such as pleats or stiffeners other mechanisms, that can be used to create a resting distance between electronic assembly 100 and outer garment layer 61 that creates a light effect. Also, because electronic assembly 100 can have a ribbon assembly 19 with multiple LEDs 5 of various colors, the different LEDs might themselves be located at different distances from light effect material 50 with which they are paired.

While the illustrative examples set forth so far have focused on garments, the concepts already described have specific defined benefits for use in footwear.

Lighting modules for footwear have traditionally been incorporated into the shoe during its manufacture, which means such modules are subjected to high heat requirements during manufacture of the shoe, where oven temperatures in the range of 90 to 140 degrees Celsius can cause damage and also melt some PVC materials used in a wire (which is why it is especially preferable to use silicone rubber as the insulative material). The present invention helps to solve the problem of high heat applied to lighting modules during the shoe manufacturing process by separating a ribbon wire assembly with mounted LEDs from a central module so that only the ribbon wire assembly with mounted LEDs is subjected to the higher oven temperatures used during the manufacturing process in which the sole or other parts of a shoe are molded. After such a ribbon wire assembly and mounted LEDs have been molded into a shoe sole, the control module can be attached to the ribbon wire assembly (such as, e.g., using a connection process disclosed in U.S. Ser. No. 13/294,095, filed Nov. 10, 2011, the disclosure of which is specifically incorporated herein by reference) and then a waterproof bag 16 can be secured about control module 15, with the manufacturing process completed without the need for subjecting control module 15 to the oven temperatures, which lessens the possibility of heat generated failures that are expensive because any such failure typically results in failure of the entire shoe, not just the control module.

Figure 18:
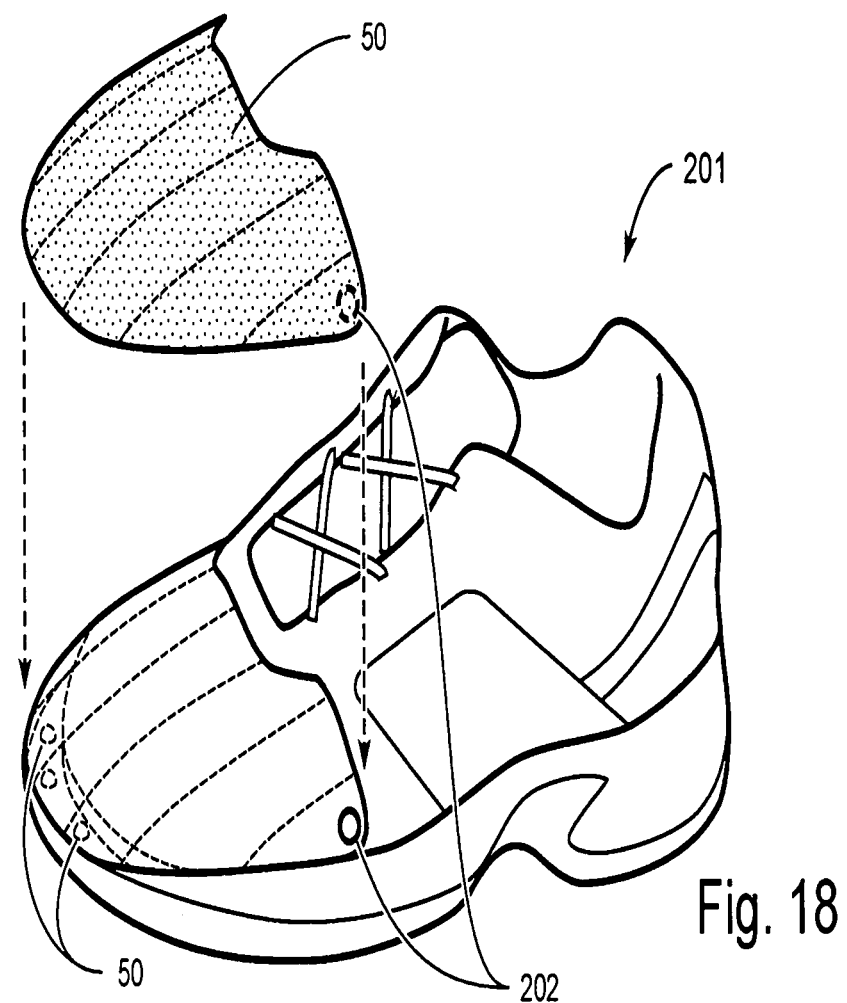
FIG. 18 illustrates an article of footwear which has a removable piece of light effect material in accordance with the present invention.

Because different light effect materials can be used to create different light effects, it may be desirable to allow different light effect materials to be alternated in a given article of manufacture. This concept is illustrated in FIG. 18 in which a light effect material 50 can be removably fastened to an article of footwear 201 by any number of fasteners 202, such as, for example, a snap or a magnet, which allows different light effect materials to be worn on a given article of footwear at different times, which also allows for customization of footwear by a user. Also, different removable light effect materials might have different colors, if a color effect is desired, and they can also contain printed graphic material, allowing for greater customization, especially if the graphic material is tied into a light effect created by the material. In addition, an additional layer of material, containing color and/or graphics, might be applied on top of light effect material, to change the visual effect created, and such additional layer of material might itself be removable from the light effect material.

FIG. 18 also illustrates an especially preferred way in which LEDs can be incorporated into a piece of footwear in a manner which minimizes the profile of space needed to utilize a light effect material in accordance with the present invention. Because it is desirable to incorporate LEDs in the toe area of a shoe, LEDs can be incorporated in a toe cap or a separate space of toe box as is illustrated in FIG. 18 in which three LEDs 5 are situated so that they are at the level of the midsole and pointed upwardly through a transparent area toward a light effect material located in the upper. (In connection with such a construction, it is especially preferred that the LED toe lights be mounted in the end of the toe cavity as close to the sole as possible.) The transparent area can be hollow, meaning its top surface is formed by the light effect material, or it can be filled with a transparent material, such as PVC or a polyurethane, or it can have a pillow-like construction (illustrated in FIG. 18) in which the area is sealed by transparent material, but it has air inside of the area instead of a transparent solid material. An advantage of this construction is that it allows for a sizable gap between the LEDs and the light effect material without requiring any additional increase in profile of the light effect material in the upper. A similar construction can be used along other areas of the shoe (e.g., LEDs can also be mounted in any location of the outsole, or around the entire outsole, if desired, with the spacing needed to create a good light effect) and, if desired, such a concept can be used around the entire periphery of the shoe. In connection with any such structure, including one in the toe area, it is especially preferred, when the transparent area is not filled with a solid material, that the walls extending from the midsole up to the light effect material be shiny, or even reflective.

Figure 19:
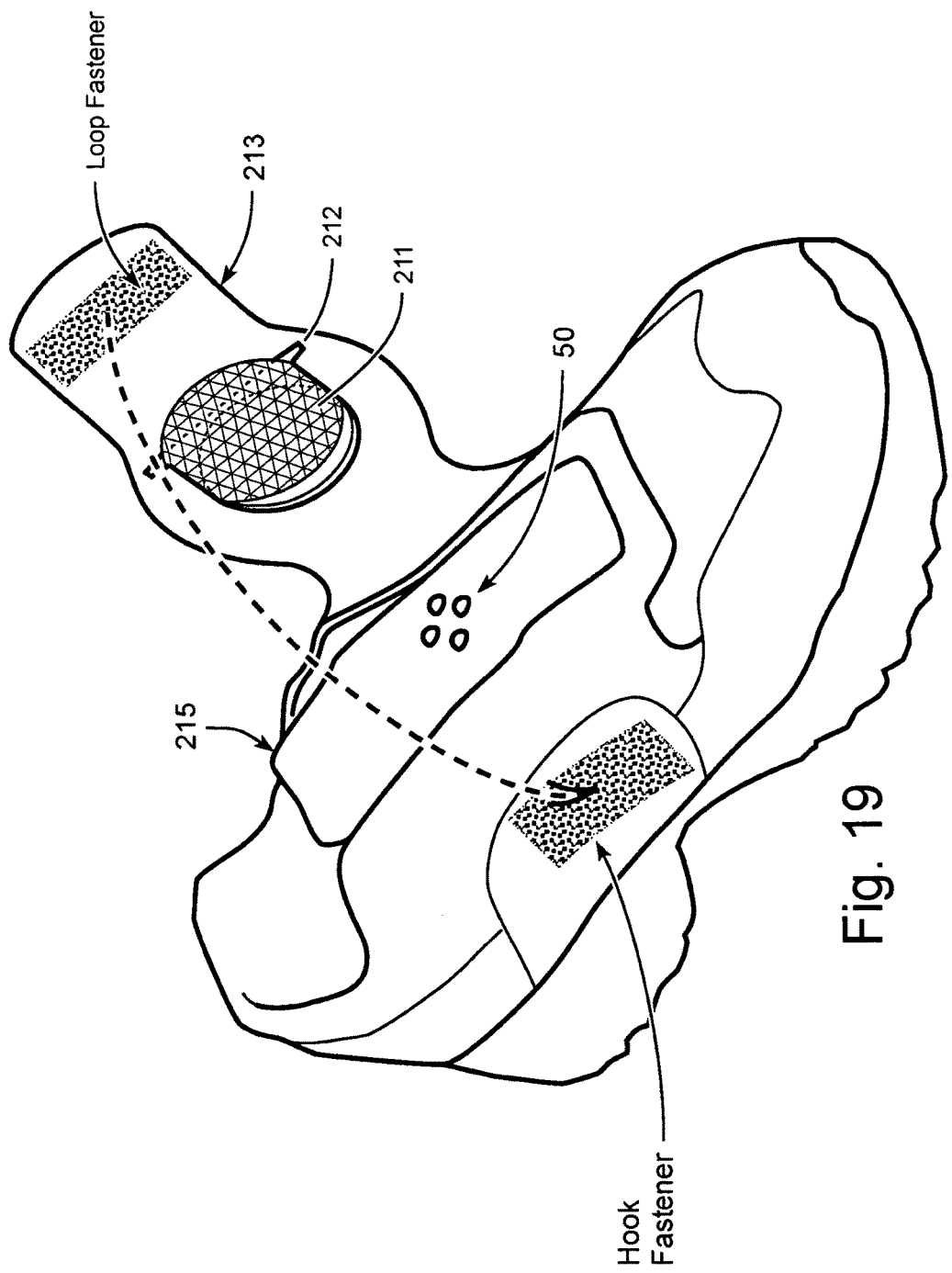
FIG. 19 illustrates an article of footwear which has a removable piece of light effect material in accordance with the present invention and also separates the light effect material in a piece that is movable away from one or more LEDs.

Alternatively, light effect material in accordance with the present invention can be incorporated into any location of a piece of footwear in which an acceptable spacing is achieved between one or more LEDs and the light effect material. Another example of this is illustrated in FIG. 19 in which the light effect is constructed as a panel 211 which is removably inserted into a slit 212 or pocket of a strap 213 which itself is removably adjustable relative to one or more LEDs 5 mounted in the tongue 215 of the footwear. Different panels of different light effect material might be inserted to achieve different visual effects, and differing panels of light effect material might be colored and/or have different graphics (or be without any graphics). Because the strap of the footwear illustrated in FIG. 19 can be adjusted by a person wearing the footwear, such a person might adjust the strap in different ways to achieve different light effects based upon differences in spacing between the light effect material held by the strap and LEDs embedded in the footwear's tongue.

In connection with the embodiments already described, electronic assembly 100 can be manufactured in accordance with known methods already in use, such as solder attachment of LEDs to wire. The remainder of this description will disclose how improvements to the electronic assembly can lead to improved lighting units.

A first improvement is described by comparison to a standard ribbon wire assembly in which one or more multi-pin LEDs are soldered to a ribbon wire that is connected to a control module containing a power source. In contrast to such assemblies, the present invention discloses an improved method for connecting multi-pin LEDs to a ribbon wire assembly by causing the multi-pin LED leads to pierce an insulative coating of a wire and then come into contact with the conductive elements of the wire while the multi-pin LED is held in place, and sealed, by use of a glue, an especially preferred example of which is a cyanoacrylate adhesive.

Figure 20A:
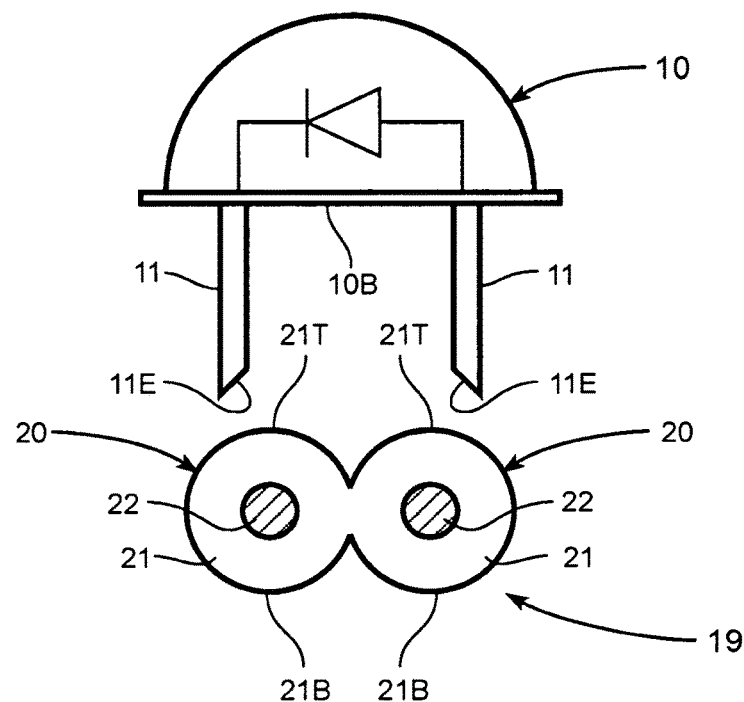
Figure 20B:
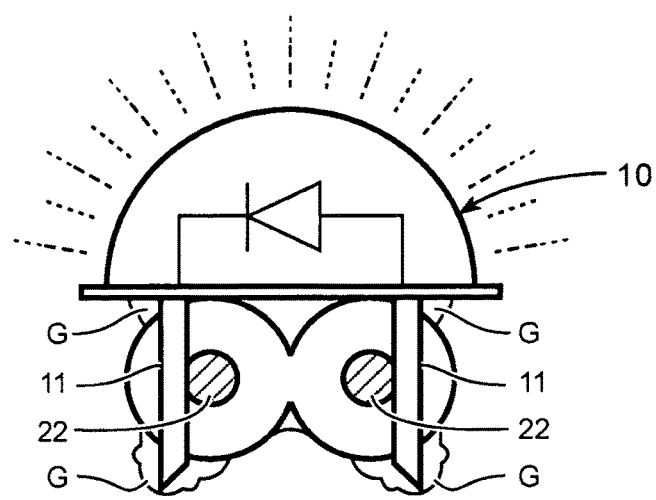
FIG. 20B illustrates the LED mounted and secured to the ribbon wire assembly with glue.
Figure 20C:
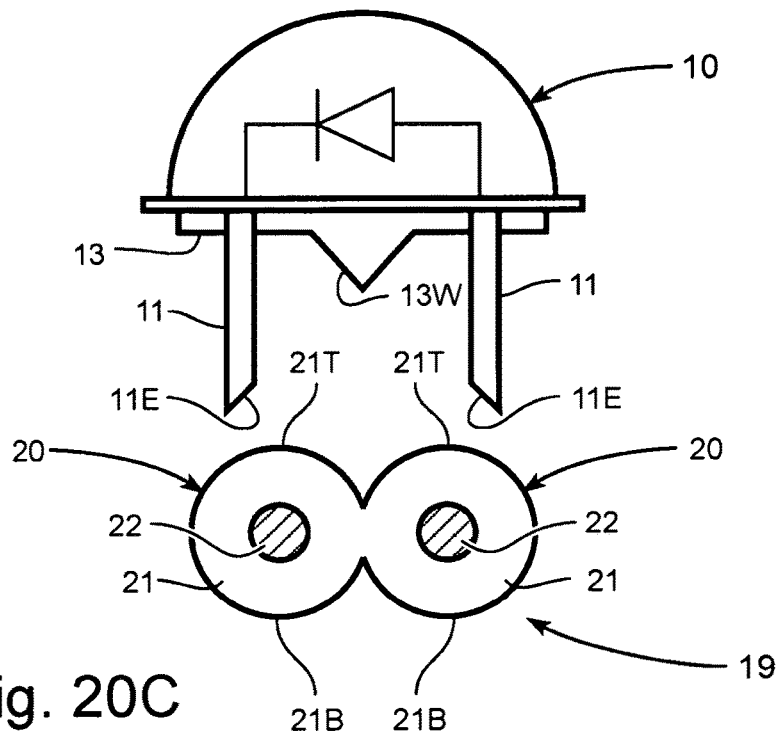
FIGS. 20C and 20D illustrate the same views as FIGS. 20A and 20B except a centering device is inserted between the LED and the ribbon wire assembly but does not puncture the insulative coatings of wires in the ribbon wire assembly.

FIGS. 20A and 20B are illustrative of the process for inserting a bi-pin LED into a ribbon wire assembly 19. Multiple bi-pin LEDs 10 can be inserted into a ribbon wire assembly 19, as is illustrated in FIG. 11, and, while the present application illustrates use of a two lead LED 10, and a ribbon wire assembly 19 with two wires, the same concepts described herein can be used with LEDs having additional leads inserted into a ribbon wire assembly with additional wires (e.g., inserting a three lead LED into a ribbon wire assembly with three wires), and thus using an illustration of a two lead LED and a ribbon wire assembly with two wires is not meant to be limiting, but simply illustrative.

It is especially preferred that the leads of the bi-pin LED, in this case two leads denoted 11, have knife-like or sharp edges, 11E, to aid in the insertion of such leads into the wires 20 of ribbon wire assembly 19. A wire, for purposes of illustration, will have an outer insulative coating 21 and an inner conductive wire 22. Inner conductive wire 22, used with a bi-pin LED, will generally consist of a single strand of solid wire, although multiple strands can also be used without impacting the import of the present invention. While inner conductive wire 22 is typically made of copper, other types of conductive material can also be used over short distances that will be used in lighting modules constructed in accordance with the present invention, so inner conductive wire 22 can also be an aluminum wire or many other conductors, such as graphite and conductive polymers, so as to avoid the cost of copper wire. Accordingly, in connection with the present disclosure, reference to a "conductive wire" means any conductive material, whether solid, stranded or some other configuration, suitable for use inside of an insulative outer wiring material. It should also be noted that the insulative outer wiring material can have an outer jacket and include other non-conductive material located between such outer jacket and conductive wire 22, or the insulative material can be a unitary material, without an outer jacket, that surrounds the conductive wire. Accordingly, in its broadest form, this aspect of the present invention is meant to apply to any type of wire that has a conductive core surrounded by insulative material.

Figure 20D:
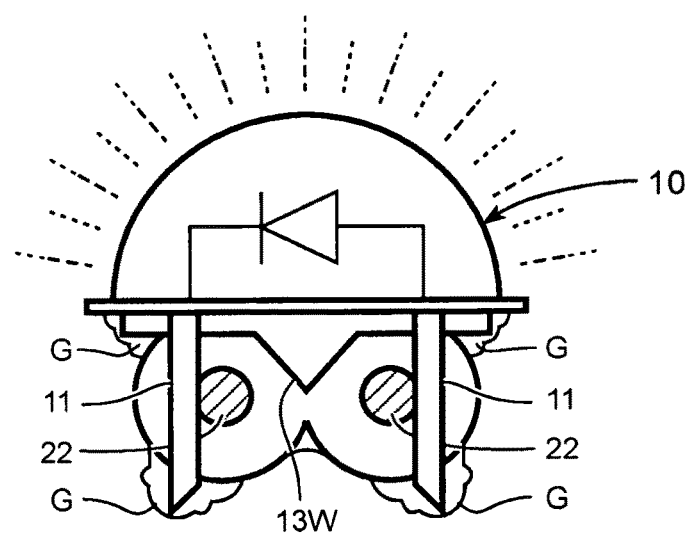
Figure 20E:
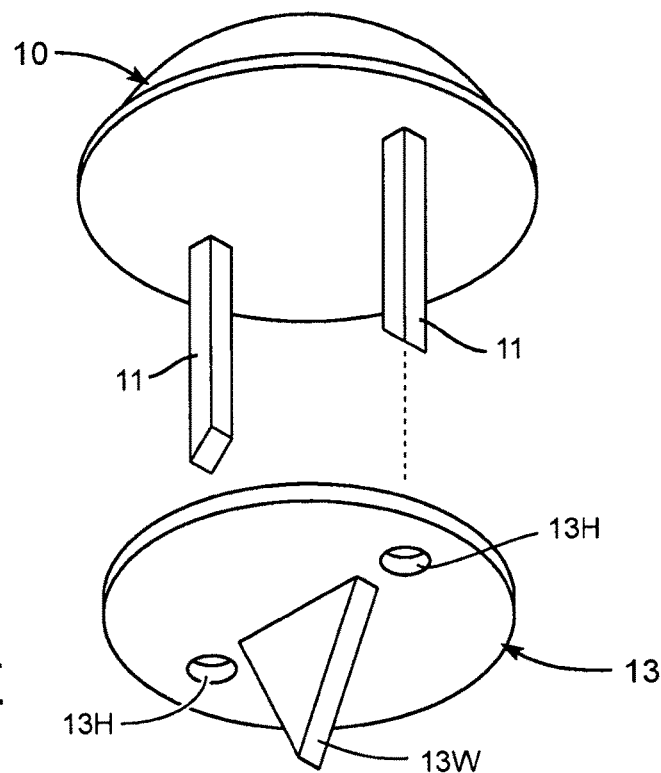
FIGS. 20E and 20F illustrate another centering device in which the insulative coatings are punctured and a part of the centering device acts as an insulator while biasing the conductive wires toward the LED leads.
Figure 20F:
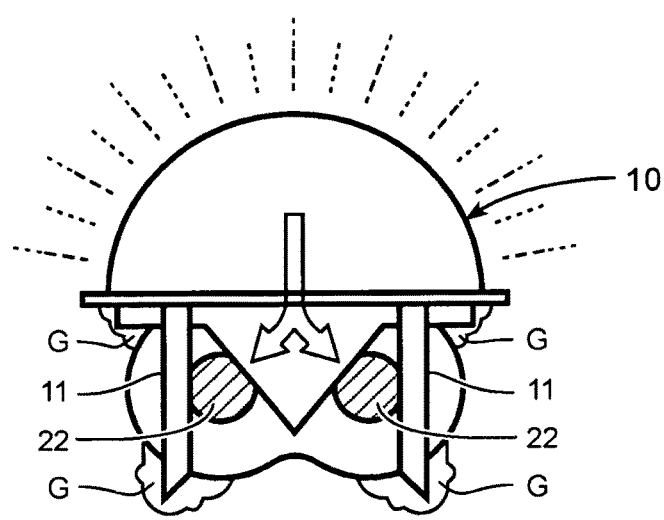

It is especially preferred that bi-pin LED leads 11 being inserted into wire 20 in accordance with the present invention are spaced so that they will be on the outside of conductive wires 22, as is illustrated in FIGS. 20B and 20D, so that adjacent conductive wires 22 are biased against leads 11 after insertion due to resiliency of insulative coatings 21. In this regard, as sharp edges 11E come into contact with inner conductive wires 22, the knife edges, which were initially used to help pierce insulative coatings 21, will cause conductive wires 22 to move slightly toward each other, thus creating a bias to return outwardly to their original positions, which helps to maintain electrical contact between leads 11 and conductive wires 22. While such biasing is especially preferred, it may also be acceptable, depending upon the construction of wire 20, for knife edges 11E to actually pierce into conductive wires 22. Also, a separate centering device 13 (examples of which are illustrated in FIGS. 20C-20F) can be affixed to bi-pin LED 10 to assist in centering and insertion of leads 11 into ribbon wire 19. It is especially preferred that centering device 13 have two holes into which leads 11 are inserted and a centering wedge 13W, which can preferably have the shape of a pyramid (see FIGS. 20C and 20E), which serves to force insulative coatings 21 of adjacent wires out toward leads 11, thus helping to bias conductive wires 22 against leads 11 after assembly, as is illustrated in FIG. 20D. Centering device 13, which is made of non-conductive plastic (and, preferably, plastic that is able to sustain high temperatures), can also be configured so that it has a wedge that pierces insulative coatings 21 and actually comes into contact with conductive wires 22 of adjacent wires 20 so that it drives them apart from each other and toward leads 11, as is shown in FIG. 20F.

When bi-pin LED 10 is mounted to ribbon wire assembly 19, glue G can be used both to help secure and waterproof the resulting assembly. There are several ways that glue can be used during such assembly, examples of which will now be described.

One method of using glue G is to apply it to tips 11E before they are inserted into insulative coatings 21 of wires 20, or to apply glue (e.g., as drops) to the tops of insulative coatings 21 into which tips 11E will be inserted. After insertion, additional glue G can be applied to bottom of insulative coatings 21 pierced by tips 11E, as is illustrated in FIG. 20B. Alternatively, glue might only be applied to the bottom of insulative coatings 21 after insertion, in a post insertion step.

It is especially preferred that leads 11 of bi-pin LED 10 are substantially isolated from contact with an outside environment once bi-pin LED is mounted to a ribbon wire assembly 19. If bi-pin LED 10 is mounted flush with ribbon wire assembly 19, leads 11 will extend from bi-pin LED base 10B directly into top 21T of insulative coating 21 with no or substantially no exposed surface area because base 10B will slightly deform and flatten top 21T; alternatively, if glue is applied at this location, any portion of leads 11 that might otherwise be exposed can still be sealed by a coating of glue (as is illustrated in FIG. 20B). The portion of a lead 11 inside of wire 19 is insulated from the outside environment by being inside of wire 19. If knife edges 11E extend through conductive wire to puncture bottom 21B of insulative coating 21, exposed knife edges 11E can, in an especially preferred embodiment, be either completely or substantially completed sealed by glue applied at such location, as is illustrated in FIGS. 20B and 20D.

A ribbon wire assembly with one or more bi-pin LEDs secured to it as described above will be completely, or at least substantially, watertight, so that it can be exposed to an environment with water (or even washed) without causing a failure of the bi-pin LED. The manner of insertion of the bi-pin LEDs will also ensure that such bi-pin LEDs remain mounted in place on the ribbon wire assembly during normal use, even when the ribbon wire assembly is washed in a washing machine (assuming its ends are also protected or sealed). As a result of such structure, such a ribbon wire assembly can be used with a control module without the need of insulating the ribbon wire assembly with the control module which, in turn, leads to simpler and cheaper construction opportunities, along with greater design flexibility.

So far the present invention has been described as using an improved method for connecting LEDs to a ribbon wire assembly by reference to LEDs with a multi-pin structure, which is the most common type of LED in use today that is not surface mounted. Such LEDs have two or more pins (or leads) 11 which exit a base structure holding a semiconductor die which has an epoxy lens/case or dome (see FIG. 20A). Light from such an LED is emitted from the semiconductor die. When strings of such bi-pin LEDs are manufactured, one lead will typically be placed into contact with a conductive wire of one insulated, conductive wire and the other lead will typically be placed into contact with a conductive wire of another insulated, conductive wire, the leads most commonly being held in place by a solder process once the insulative coating has been removed to allow the leads to make electrical contact with the conductive wire. Once one or more LEDs are mounted on the insulated, conductive wire, light will not be emitted down through the base or through the insulated, conductive wire to which the LED is attached.

One problem associated with such strings of LEDs in common use today is that the string relies upon solder to securely connect the LEDs to the conductive wire. Use of solder raises environmental concerns and is costly, not only in terms of solder, but in terms of the type of wire which will bond with solder, and also the labor involved in the soldering process. As already noted, the present invention can do away with all such concerns by eliminating the need for solder bonding, simplifying the underlying structure, and creating an LED embedded wire that can be manufactured inexpensively through the use of automated processes that do not require solder, while still achieving a superior product in terms of having a low profile from a smaller dome profile.

Figure 22:
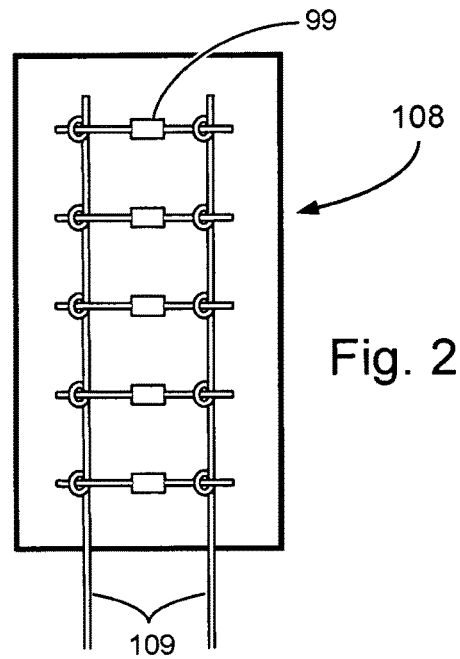
Figure 23:
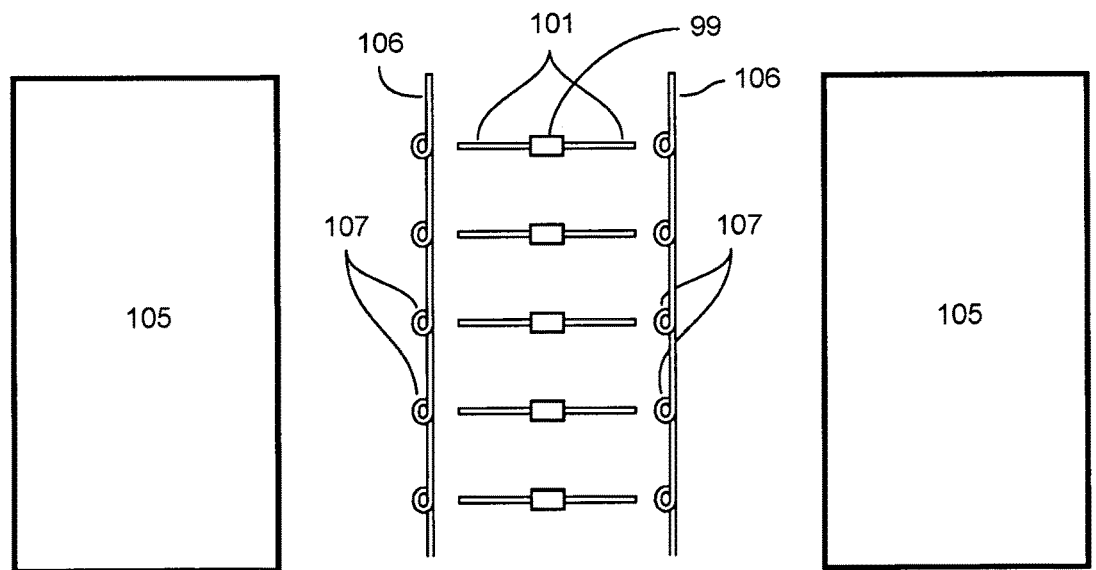
FIG. 23 is an exploded assembly drawing showing the parts included in FIG. 22.
Figure 24:
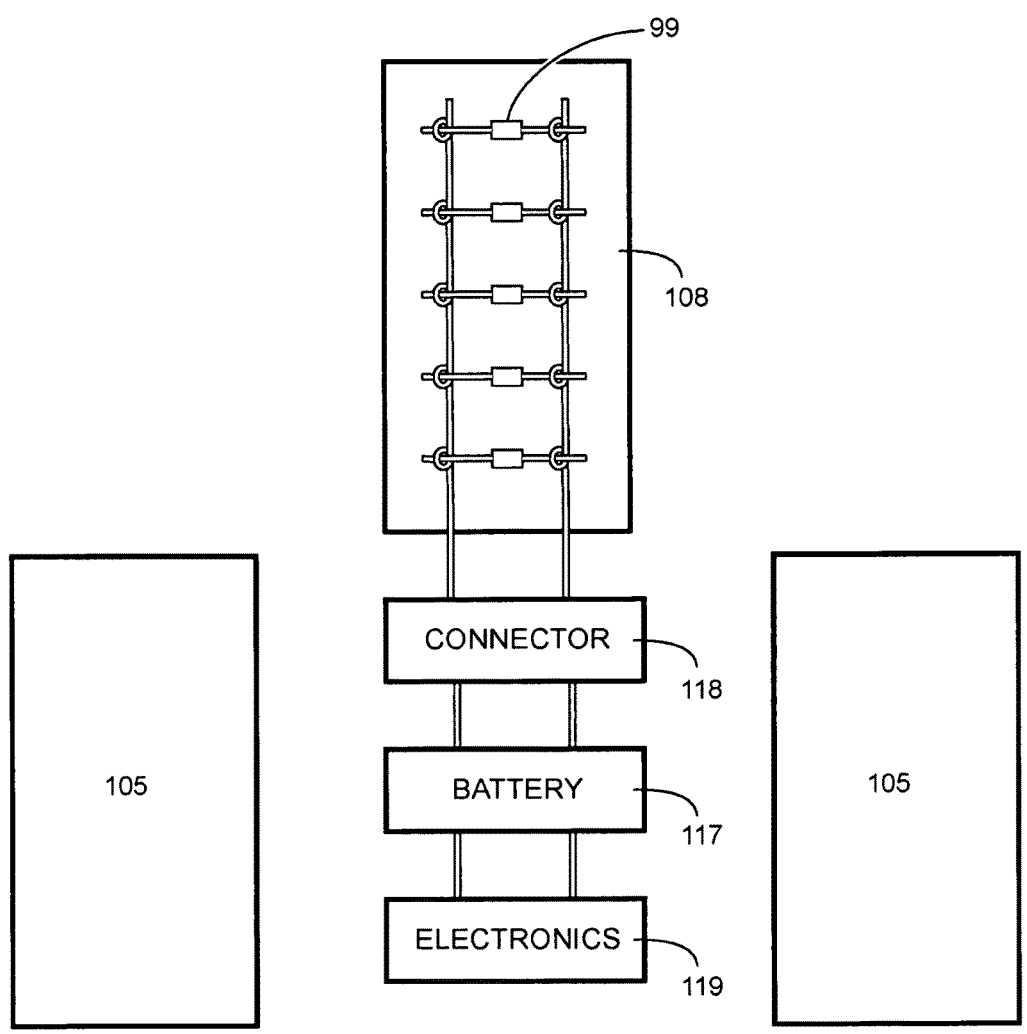
FIG. 24 is an exploded assembly drawing showing the composite LED embedded wire of FIG. 22 being connected to a battery and electronics in a new assembly.

In accordance with another aspect of the present invention, an axial LED, shown generally as 99 in FIG. 21A, has positive and negative axial leads 101. Multiple axial LEDs can be aligned so that their axial leads are in a single plane and parallel to each other as illustrated in FIGS. 22 and 23. The axial leads of one side of the LEDs are connected together by a conductive wire 106 that can be done by an automated wire looping process while the axial leads of the other side of the LEDs are connected together by a second conductive wire 106 that can be done by another automated wire looping process. While multiple loops might be used to secure the conductive wire to the axial leads, it has been found that a single loop 107 will work. Once the axial lead LEDs 99 have had their axial leads electrically connected together by two conductive wires 106, this subassembly can be secured, and waterproofed, by using two strips of clear tape 105. While it is especially preferred that each of the two strips of clear tape 105 have an adhesive layer, so that the two adhesive layers come together to bond with each other and hold the subassembly of axial LEDs and conductive wires between the two pieces of clear tape, only one inner side of one of the strips of clear tape 105 need have an adhesive on it. Also, it is especially preferred that at least one of such pieces of tape 105 have clear fibers in it for adding strength and durability to the resulting composite LED embedded wire.

While this aspect of the present invention has been described as using two strips of tape 105, it has already been noted that one of such strips may not have adhesive on it, and thus might not be considered a piece of "tape," but a plastic strip. Accordingly, for purposes of the present invention, "tape" shall include any layers of material that can be bonded together or connected together to form a watertight covering, similar to two pieces of tape stuck together. Also, although it is not especially preferred, because it requires the use of heat, and is not as easily automated, shrink wrap materials, such as a polyolefin or other compositions, can be used to encase and seal a series of axial LEDs whose axial leads have been electrically connected together in accordance with the teachings of the present invention.

It should be noted that strings of axial LEDs do not have to have all of their axial leads connected in series if the string is to be used with an alternating current so that one group of axial LEDs will light at one time with one polarity of current while a second group of axial LEDs will light at another time with current of an opposite polarity.

It is also worth noting that there may be certain applications in which one or both pieces of tape 105 may have a color or have some other characteristic applied over their whole surface, or a portion of such surface, so as to create a preselected affect upon the light given off by one or more axial LEDs contained within a composite LED embedded wire according to the present invention.

A composite LED embedded wire according to this aspect of the present invention can be used in a variety of applications, including, to name only a few, clothing, footwear, Christmas lights, and anywhere where a string of LEDs is desired. If a composite LED embedded wire according to the present invention is used in clothing, excess tape 105 can be used to provide a surface which can be stitched so that the composite can easily be incorporated into a piece of clothing.

Another advantage of the present invention is that an axial LED can have a lower profile dome 104 than the dome of a bi-pin LED. In addition, whereas a string of prior art bi-pin LEDs will not emit light in more than 180 degrees, a composite LED embedded wire 108 in accordance with the present invention can emit light in a more spherical fashion because an axial LED does not require a base through which anode and cathode leads exit, nor is it mounted on top of insulative, conductive wires.

A composite axial lead LED embedded wire according to the present invention will waterproof its components, other than conductive wire leads 109 extending out beyond the waterproofing protection of two opposing layers of tape 105, while being extremely flexible and low profile. In fact, composite axial lead LED embedded wire according to this aspect of the present invention can be wound around a spool, in the fashion of a ribbon, for storage, for use in assembly, or for application. Indeed, a composite axial lead LED embedded wire according to the present invention can quickly and easily be connected to a battery 117 by use of a connector 118 and, if desired, optional additional electronics 119 can also be electrically connected to perform additional functions such as a motion switch, sequencing of the axial lead LEDs 100, and the like. Once a composite axial lead LED embedded wire 108 is connected to a battery 117, and optional electronics 119, the new resulting assembly can quickly and easily be waterproofed and sealed from the environment by use of two additional pieces of tape 105 functioning in the same fashion as tape 105 included in composite LED embedded wire 108. Indeed, in a very simple application, a composite axial lead LED embedded wire 108 could be connected to a battery 117 to create a one-time, disposable LED light source, such as might be used in an emergency. Alternatively, rather than using tape 105, a composite axial lead LED embedded wire could be connected to a battery 117 through a more robust connection which allows for battery 117 to be replaced or recharged, and electronics 119 might contain an on/off switch or electronics for connection to a regular power source, in which case a plug or other hardware can also be incorporated for use to connecting such power source, and any such plug or other hardware might be protected in its own packaging or even be connected through additional use of tape so as to create a simple, inexpensive and easy to install system. Also, in any such structure, one of the pieces of tape can have two-sided adhesive so that the composite axial lead LED embedded wire can be secured, by a simple taping action, to a variety of surfaces, depending upon particular applications.

While the present invention has described a composite axial lead LED embedded wire in which axial lead LEDs are electrically connected to conductive wires without the use of solder, which allows such conductive wires to be made of metal such as aluminum, the teachings set forth herein could also be used to assemble a less preferred embodiment, which would still represent an advance over the prior art, in which the axial lead LEDs are in fact soldered to conductive wire, such as copper, and then the resultant assembly is encased by tape as described herein when no solder is used.

Also, while axial lead LEDs are particularly well suited to use in strings, as illustrated in FIG. 22, a single axial lead LED can be singularly connected to a conductive wire as illustrated in FIGS. 21A and 21B. In such use insulative coating 21 is stripped from conductive wire 22 and glue G is used to secure the two exposed conductive wires to axial leads 102 and 103, preferably after the exposed conductive wires have been wrapped about the axial leads.

It is also worth noting that a person of ordinary skill in the art, armed with the present disclosure, could choose to create different lighting effects by using combinations of different light effect materials in a single application, such as side-by-side, or by combining multiple light effect materials together in an overlapping configuration in which each light effect material adds its own effect to a total overall effect. Such a designer can also create a number of new effects by using multi-sequenced LEDs as taught in my U.S. Ser. No. 14/199,689, filed Mar. 6, 2014, the disclosure of which is specifically incorporated herein by reference. Accordingly, the use of light effect materials, with the other inventive concepts disclosed herein, opens up a vast variety of designer choices not obtainable before the present invention.

This now brings us to the additional new improvements set forth in the present disclosure.

In accordance with the present invention, a self-contained insertion assembly 400 is manufactured which contains all of the electronics and LEDs in a single assembled unit which can include (or not) a light effect material and is removably inserted into a pocket prepared in a garment or other item of manufacture. The pocket is designed to keep the unit correctly orientated if orientation is required for a switch while also allowing for easy removal and or replacement of one or more units and/or sheets of light effect material while still also allowing for a light effect to be visible outside of the pocket.

Figure 25:
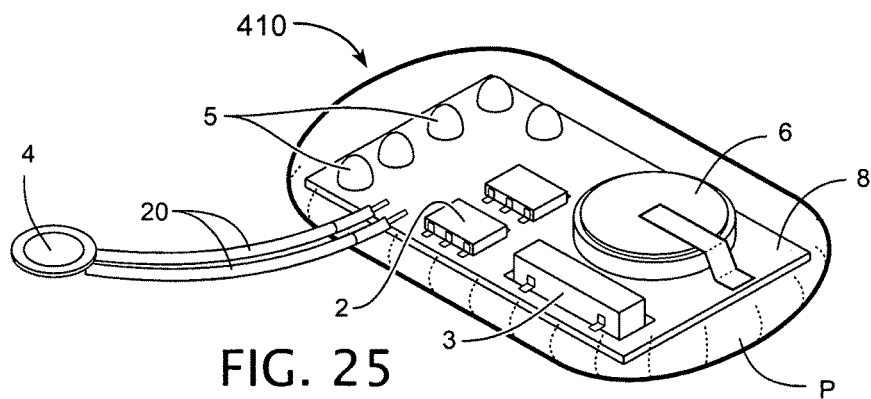
FIG. 25 illustrates an assembly useful in the present invention in which all of the electronics, except for an on/off switch, are enclosed within a potting material.

As illustrated in FIG. 25, a battery 6 is directly mounted to a PCB 8 which also contains one or more LEDs 5, electronics 2 and a switch 3 (which may either be mounted directly to the surface of PCB 8 to which the other components are mounted or, if desired, mounted in a recess or hole formed in PCB 8 to reduce the elevation profile of switch 3). LEDs 5, electronics 2 and battery 3 are mounted to the same surface of PCB 8 and the LEDs are arranged so that a distance D between them and other components such as battery 6 and switch 3 minimizes light emitted from the LEDs coming into direct contact with the elevational profile of such components which will interfere with the pattern of light emitted due to shadow effects. If an on/off switch 4 is included, it can be connected by wires 20 to the same surface of PCB 8 to which LEDs 5 are mounted, as is illustrated in FIG. 25. The assembly described so far (but not on/off switch 4), once assembled, is encased in a clear potting material P to create an assembly 410. It is especially desirable that potting material P is used to create the transparent space with a preselected distance needed between LEDs 5 and light effect material 50 so as to create a light material viewing effect.

Figure 26:
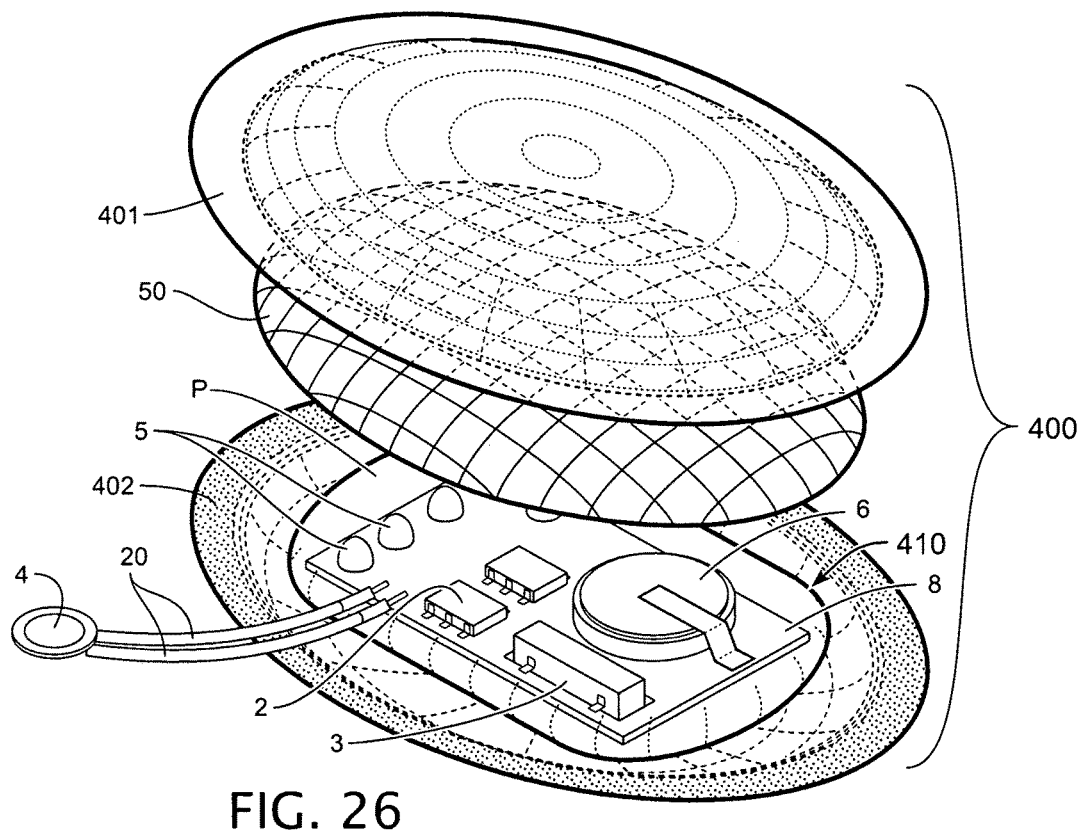
FIG. 26 is an exploded view which illustrates how the assembly of FIG. 25 can be included within another larger insertable assembly which can be inserted into a pocket as is illustrated in FIG. 27 in which two assemblies are each being inserted into a pocket, one also having an additional loose layer of light effect material being inserted with it into a pocket.

Assembly 410, in an especially preferred embodiment, is combined with light effect material 50 and two pieces of plastic material 401 and 402 to create a further assembly 400. It is especially preferred that plastic material 402 is self-sealing to plastic material 401 and allows for attachment 410 to be stuck to it. In an alternative embodiment, plastic material 401 may itself be a light effect material 50, thus removing the need for three sheets of material illustrated in FIG. 26. In another alternative embodiment, assembly 410 may be included within another structure, such as a clear envelope or the like, and then attached to light effect material 50 (e.g., by using clear adhesive or tape or the like), and then assembly 410 or assembly 400 and (any additional structure) and one or more sheets of light effect material 50

Figure 27:
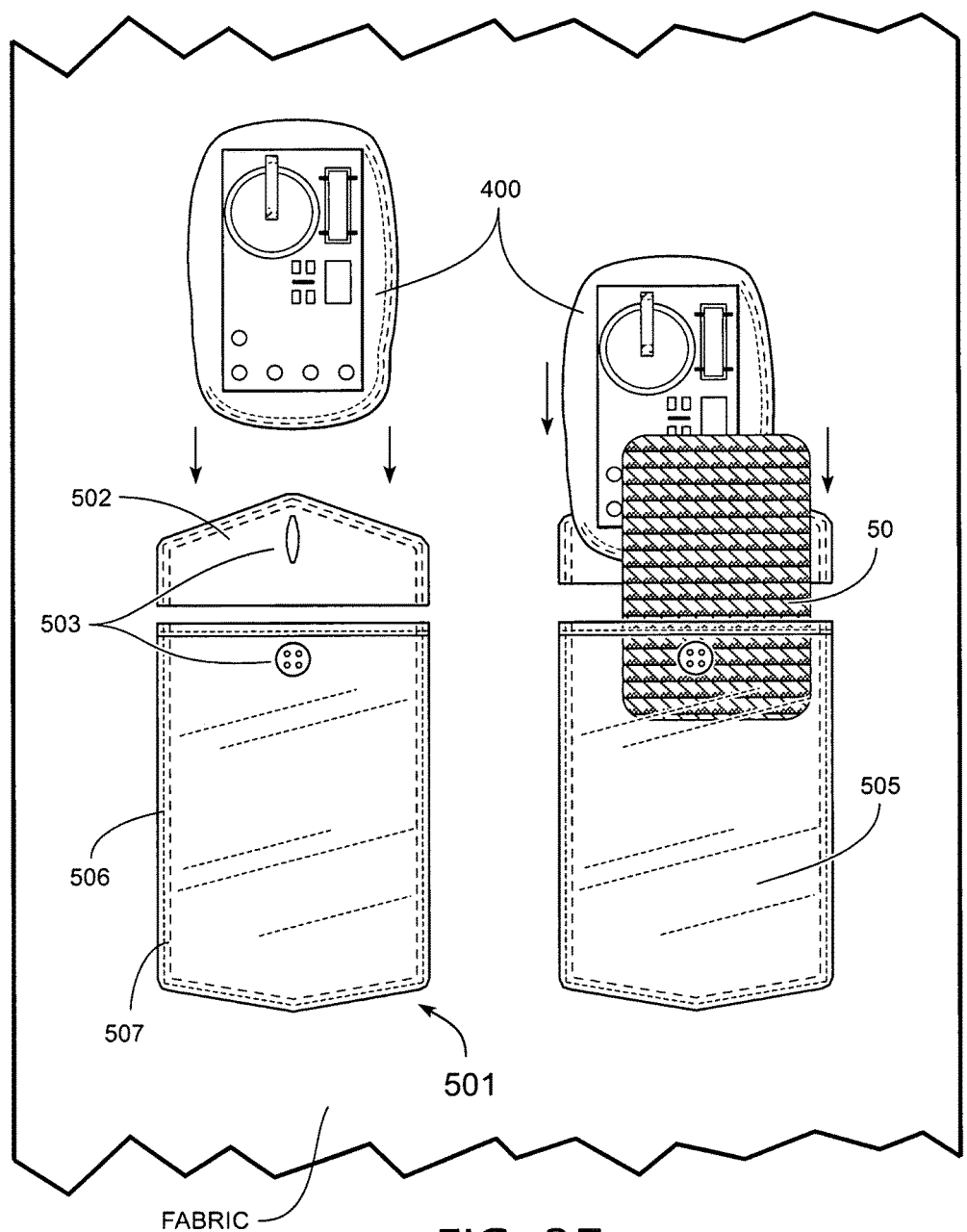

(all of which will hereinafter collectively be referred to in any combination or sub-combination, for ease of reference, as removable assembly 500) may be removably inserted into a pocket 501 designed for receiving removable assembly 500, an example of which is shown in FIG. 27.

It is desirable for pocket 501 to have some type of reversible closing mechanism 503 to retain removable assembly 500 within it, and such closure mechanism can take any number of forms, examples of which include, but are not limited to, a zipper, a snap, a button, or a hook and loop fastener, which may or may not use a separate flap of material 502 which partially covers pocket 501 and is used in connection with reversible closing mechanism 503. In an especially preferred embodiment, pocket 501 has a clear portion 505, a border 506 and some attachment mechanism 507 (e.g., stitching or heat seal) for attaching pocket 501 to a surface of a garment (such as a piece of clothing or shoe) or other article of manufacture (e.g., a backpack, toy or something else). Alternatively, pocket 501 itself might be attached to a surface, such as that of a cell phone, by an adhesive layer or the like. It is worth noting that clear portion 505 may include its own artwork or be comprised of light effect material 50, or have light effect material 50 attached to it, in alternative embodiments, and may also be a sheer material, rather than a clear material.

Use of multiple pockets 501 on a single surface or garment, especially when combined with multiple sheets of light effect material 50 that are easily combined or removed from a single pocket, and the possibility of differing removable assemblies 500 (which might have different numbers of LEDs, or colors of LEDs, or patterns of lighting) create the possibility of a great many customizable variations of light effect viewable on the single surface or garment. Also, multiple removable assemblies 500 and differing sheets of light effect material 50 might be sold in a kit for use in customizing a given garment or for use in replacing a removable assembly 500 in a given pocket or garment. Indeed, a garment with a specially designed pocket 501 might be sold or shipped separate from a removable assembly 500 designed for use in such garment.

Although the foregoing detailed description is illustrative of preferred embodiments of the present invention, it is to be understood that additional embodiments thereof will be obvious to those skilled in the art. Further modifications are also possible in alternative embodiments without departing from the inventive concept.

Accordingly, it will be readily apparent to those skilled in the art that still further changes and modifications in the actual concepts described herein can readily be made without departing from the spirit and scope of the disclosed inventions.

What is claimed is:

1. An article of manufacture, comprising:
   a pocket;
   a light effect material having an inner surface and an outer surface with a plurality of dispersive elements; and
   a lighting unit removably insertable within the pocket, wherein said lighting unit comprises:
   a printed circuit board ("PCB") having a first side;
   one or more light emitting diodes ("LEDs") mounted to the first side of the PCB, each of the one or more LEDs having a light emitting die that emits light when it is energized;
   a battery mounted to the first side of the PCB;
   electronics mounted to the PCB for turning on an electrical circuit which includes the one or more LEDs to cause each light emitting die of the one or more LEDs to emit light;
   a clear potting material which encloses the PCB, one or more LEDs, the battery and the electronics and creates a transparent space proximate the inner surface which maintains the light effect material at a preselected distance from the one or more LEDs and each light emitting die is substantially parallel to the light effect material so that light emitted from each light emitting die is dispersed by the plurality of dispersive elements so as to create a light material viewing effect;
   wherein the light material viewing effect is created for a viewer viewing light emitted from each light emitting die through a first viewing path that begins with each light emitting die, then goes through the transparent space, then goes through the inner surface, then goes through the outer surface, then goes to the viewer;
   wherein a non-light material viewing effect is created for the viewer viewing light emitted from each light emitting die through a second viewing path in which the light effect material has been removed and the second viewing path begins with each light emitting die, then goes through the transparent space, then goes to the viewer; and
   wherein the viewer perceives the light material viewing effect to extend over a wider area than the non-light material viewing effect when the first viewing path and the second viewing path have an identical preselected distance.

2. The article of manufacture of claim 1, wherein the electronics comprise a control device powered by the battery for controlling electric current provided to the one or more LEDs and a switch for providing a signal to the control device for turning on the electrical circuit.

3. The article of manufacture of claim 2, further comprising an on/off switch for turning on the electrical circuit on and off, said on/off switch being electrically connected to the PCB but not enclosed within the clear potting material.

4. The article of manufacture of claim 1, wherein the lighting unit is enclosed within two pieces of material to form an assembly.

5. The article of claim 4, wherein one of the two pieces of material is comprised of the light effect material.

6. The article of claim 4, wherein the light effect material is enclosed within the two pieces of material.

7. The article of claim 4, wherein the light effect material is attached to an outer surface of one of the type pieces of material.

8. The article of manufacture of claim 1, further comprising means for enclosing the lighting unit within the pocket.

9. The article of manufacture of claim 1, wherein the light effect material is removably insertable within the pocket.

10. The article of manufacture of claim 1, wherein the light effect material is part of the pocket.

11. The article of manufacture of claim 1, wherein the pocket is attached to a garment.

12. The article of manufacture of claim 11, wherein the garment is comprised of a shoe.

13. An article of manufacture, comprising:
    a light effect material having an inner surface and an outer surface with a plurality of dispersive elements; and
    a lighting unit configured to provide light to the light effect material, wherein said lighting unit comprises:
    a printed circuit board ("PCB") having a first side;

one or more light emitting diodes ("LEDs") mounted to the first side of the PCB, each of the one or more LEDs having a light emitting die that emits light when it is energized;

a battery mounted to the first side of the PCB;

electronics mounted to the PCB for turning on an electrical circuit which includes the one or more LEDs to cause each light emitting die of the one or more LEDs to emit light;

a clear potting material which encloses the PCB, one or more LEDs, the battery and the electronics and creates a transparent space proximate the inner surface which maintains the light effect material at a preselected distance from the one or more LEDs and each light emitting die is substantially parallel to the light effect material so that light emitted from each light emitting die is dispersed by the plurality of dispersive elements so as to create a light material viewing effect;

wherein the light material viewing effect is created for a viewer viewing light emitted from each light emitting die through a first viewing path that begins with each light emitting die, then goes through the transparent space, then goes through the inner surface, then goes through the outer surface, then goes to the viewer;

wherein a non-light material viewing effect is created for the viewer viewing light emitted from each light emitting die through a second viewing path in which the light effect material has been removed and the second viewing path begins with each light emitting die, then goes through the transparent space, then goes to the viewer; and wherein the viewer perceives the light material viewing effect to extend over a wider area than the non-light material viewing effect when the first viewing path and the second viewing path have an identical preselected distance.

14. The article of manufacture of claim 13, wherein the electronics comprise a control device powered by the battery for controlling electric current provided to the one or more LEDs and a switch for providing a signal to the control device for turning on the electrical circuit.

15. The article of manufacture of claim 14, further comprising an on/off switch for turning on the electrical circuit on and off, said on/off switch being electrically connected to the PCB but not enclosed within the clear potting material.

16. The article of manufacture of claim 13, wherein the lighting unit is enclosed within two pieces of material to form an assembly.

17. The article of claim 16, wherein one of the two pieces of material is comprised of the light effect material.

18. The article of claim 16, wherein the light effect material is enclosed within the two pieces of material.

19. The article of claim 16, wherein the light effect material is attached to an outer surface of one of the type pieces of material.

* * * * *